(12) United States Patent  
Sakui

(10) Patent No.: US 10,074,430 B2  
(45) Date of Patent: Sep. 11, 2018

(54) MULTI-DECK MEMORY DEVICE WITH ACCESS LINE AND DATA LINE SEGREGATION BETWEEN DECKS AND METHOD OF OPERATION THEREOF

(71) Applicant: Micron Technology, Inc., Boise, ID (US)

(72) Inventor: Koji Sakui, Setagayaku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/231,011

(22) Filed: Aug. 8, 2016

(65) Prior Publication Data

US 2018/0040377 A1 Feb. 8, 2018

(51) Int. Cl.

| G11C 16/04 | (2006.01) |
|---|---|
| G11C 16/24 | (2006.01) |
| G11C 16/26 | (2006.01) |
| G11C 16/10 | (2006.01) |

(52) U.S. Cl.
CPC ......... *G11C 16/0483* (2013.01); *G11C 16/10* (2013.01); *G11C 16/24* (2013.01); *G11C 16/26* (2013.01)

(58) Field of Classification Search
None
See application file for complete search history.

(56) References Cited

U.S. PATENT DOCUMENTS

| 5,680,347 | A | * | 10/1997 | Takeuchi | G11C 7/12 365/185.05 |
|---|---|---|---|---|---|
| 5,818,756 | A | * | 10/1998 | Sakui | G11C 16/16 365/185.17 |
| 7,920,408 | B2 | * | 4/2011 | Azuma | G11C 13/0007 365/148 |
| 8,576,629 | B2 | * | 11/2013 | Choe | G11C 16/0483 365/185.14 |
| 8,837,222 | B2 | * | 9/2014 | Tanzawa | G11C 16/04 365/185.11 |
| 9,362,300 | B2 | * | 6/2016 | Lu | G11C 16/0483 |
| 9,543,003 | B2 | * | 1/2017 | Lee | G11C 5/025 |

(Continued)

OTHER PUBLICATIONS

"International Application Serial No. PCT/US2017/045762, International Search Report dated Nov. 10, 2017", 3 pgs.

(Continued)

*Primary Examiner* — Anthan Tran
*Assistant Examiner* — Mushfique Siddique
(74) *Attorney, Agent, or Firm* — Schwegman Lundberg & Woessner, P.A.

(57) ABSTRACT

Some embodiments include apparatuses and methods using a substrate, a first memory cell block including first memory cell strings located over the substrate, first data lines coupled to the first memory cell strings, a second memory cell block including second memory cell strings located over the first memory cell block, second data lines coupled to the second memory cell strings, first conductive paths located over the substrate and coupled between the first data lines and buffer circuitry of the apparatus, and second conductive paths located over the substrate and coupled between the second data lines and the buffer circuitry. No conductive path of the first and second conductive paths is shared by the first and second memory cell blocks.

10 Claims, 10 Drawing Sheets

(56) References Cited

U.S. PATENT DOCUMENTS

| | | | |
|---|---|---|---|
| 2003/0147269 A1 | 8/2003 | Nishihara | |
| 2006/0146608 A1* | 7/2006 | Fasoli | G11C 16/0483 365/185.17 |
| 2007/0030737 A1* | 2/2007 | Aritome | G11C 16/0483 365/185.25 |
| 2008/0258129 A1 | 10/2008 | Toda | |
| 2009/0244968 A1* | 10/2009 | Maejima | G11C 11/5628 365/185.03 |
| 2010/0002516 A1* | 1/2010 | Sim | G11C 5/02 365/185.17 |
| 2010/0067300 A1* | 3/2010 | Nakamura | G11C 16/0483 365/185.17 |
| 2011/0286283 A1* | 11/2011 | Lung | G11C 16/0483 365/185.28 |
| 2012/0063194 A1* | 3/2012 | Baek | G11C 5/025 365/148 |
| 2012/0075934 A1* | 3/2012 | Louie | G11C 16/0483 365/185.23 |
| 2012/0134210 A1* | 5/2012 | Maeda | G11C 16/0483 365/185.11 |
| 2013/0051145 A1* | 2/2013 | Ahn | G11C 16/0483 365/185.11 |
| 2013/0051146 A1* | 2/2013 | Yun | G11C 16/0483 365/185.11 |
| 2013/0235673 A1* | 9/2013 | Kwak | G11C 16/06 365/185.18 |
| 2013/0258745 A1* | 10/2013 | Tanzawa | G11C 16/08 365/72 |
| 2013/0258785 A1* | 10/2013 | Sakui | G11C 16/0483 365/185.29 |
| 2013/0272067 A1* | 10/2013 | Lee | G11C 16/10 365/185.11 |
| 2013/0277731 A1* | 10/2013 | Goda | H01L 27/11556 257/324 |
| 2014/0036590 A1* | 2/2014 | Feeley | G11C 16/0483 365/185.11 |
| 2014/0056049 A1* | 2/2014 | Tanzawa | G11C 5/06 365/63 |
| 2014/0061747 A1* | 3/2014 | Tanzawa | H01L 29/66833 257/314 |
| 2014/0063959 A1* | 3/2014 | Tanzawa | G11C 16/0483 365/185.17 |
| 2014/0104948 A1* | 4/2014 | Rhie | G11C 8/08 365/185.11 |
| 2014/0119117 A1* | 5/2014 | Sakui | G11C 16/0483 365/185.05 |
| 2014/0192594 A1* | 7/2014 | Lue | G11C 16/10 365/185.11 |
| 2014/0219025 A1* | 8/2014 | Kang | G11C 16/10 365/185.11 |
| 2014/0313839 A1* | 10/2014 | Sakui | G11C 16/0483 365/191 |
| 2014/0369116 A1* | 12/2014 | Sakui | G11C 16/3427 365/185.02 |
| 2015/0003150 A1* | 1/2015 | Aritome | G11C 16/3427 365/185.02 |
| 2015/0003158 A1* | 1/2015 | Aritome | G11C 16/0483 365/185.11 |
| 2015/0070994 A1* | 3/2015 | Hosono | G11C 16/08 365/185.11 |
| 2015/0162084 A1* | 6/2015 | Morooka | G11C 16/06 365/185.11 |
| 2015/0228349 A1* | 8/2015 | Park | G11C 7/1006 365/185.11 |
| 2015/0255161 A1* | 9/2015 | Lee | G11C 16/16 365/185.12 |
| 2015/0294722 A1* | 10/2015 | Fukano | G11C 8/10 365/185.11 |
| 2015/0340096 A1* | 11/2015 | Shim | G11C 5/063 365/185.13 |
| 2015/0357344 A1* | 12/2015 | Tanzawa | G11C 16/08 257/314 |
| 2016/0086669 A1* | 3/2016 | Kim | G11C 5/063 365/185.11 |
| 2016/0104717 A1* | 4/2016 | Lu | G11C 16/0483 365/185.22 |
| 2016/0111161 A1* | 4/2016 | Louie | G11C 16/08 365/185.12 |
| 2016/0148703 A1* | 5/2016 | Kim | G11C 16/26 365/185.11 |
| 2016/0163390 A1* | 6/2016 | Park | G11C 16/10 365/185.11 |
| 2016/0172041 A1* | 6/2016 | Sakui | G11C 16/3459 365/185.03 |
| 2016/0180934 A1* | 6/2016 | Sakui | G11C 16/0483 365/185.11 |
| 2016/0284728 A1* | 9/2016 | Lu | G11C 16/0483 |
| 2017/0110198 A1* | 4/2017 | Zhao | G11C 16/3459 |

OTHER PUBLICATIONS

"International Application Serial No. PCT/US2017/045762, Written Opinion dated Nov. 10, 2017", 7 pgs.

* cited by examiner

200

200

600

600

| 600A | READ | | WRITE | | ERASE | | |
|---|---|---|---|---|---|---|---|
| | DECK $215_0$ SELECTED | DECK $215_1$ SELECTED | DECK $215_0$ SELECTED | DECK $215_1$ SELECTED | DECK $215_0$ SELECTED | DECK $215_1$ SELECTED | BOTH DECKS SELECTED |
| $SRC_0$ | Vss | FLOAT | Vcc | FLOAT | Verase | FLOAT | Verase |
| $SRC_1$ | FLOAT | Vss | FLOAT | Vcc | FLOAT | Verase | Verase |
| $BL0_0$ | Vbl | FLOAT | Vcc/Vss | FLOAT | Verase | FLOAT | Verase |
| $BL0_1$ | FLOAT | Vbl | FLOAT | Vcc/Vss | FLOAT | Verase | Verase |
| $SGDx_0$ | Vcc | Vss | Vcc | Vss | Verase−Vy | FLOAT | Verase−Vy |
| $SGDx_1$ | Vss | Vcc | Vss | Vcc | FLOAT | Verase−Vy | Verase−Vy |
| $SGS_0$ | Vcc | Vss | Vcc | Vss | Verase−Vy | FLOAT | Verase−Vy |
| $SGS_1$ | Vss | Vcc | Vss | Vcc | FLOAT | Verase−Vy | Verase−Vy |
| BL-LO | Vcc | Vcc | Vcc | Vcc | Verase | Vss | Verase |
| BL-UP | Vss | Vss | Vss | Vss | Vss | Verase | Verase |

|  | READ | | | WRITE | | | ERASE | | |
|---|---|---|---|---|---|---|---|---|---|
|  | DECK $215_0$ SELECTED | DECK $215_1$ SELECTED | BOTH DECKS SELECTED | DECK $215_0$ SELECTED | DECK $215_1$ SELECTED | BOTH DECKS SELECTED | DECK $215_0$ SELECTED | DECK $215_1$ SELECTED | BOTH DECKS SELECTED |
| $SRC_0$ | Vss | FLOAT | Vss | Vcc | FLOAT | Vcc | Vrease | FLOAT | Vrease |
| $SRC_1$ | FLOAT | Vss | Vss | FLOAT | Vcc | Vcc | FLOAT | Vrease | Vrease |
| $BL0_0$ | Vbl | FLOAT | Vbl | Vcc/Vss | FLOAT | Vcc/Vss | Vrease | FLOAT | Vrease |
| $BL0_1$ | FLOAT | Vbl | Vbl | FLOAT | Vcc/Vss | Vcc/Vss | FLOAT | Vrease | Vrease |
| $SGDx_0$ | Vcc | Vss | Vcc | Vcc | Vss | Vcc | Verase−Vy | FLOAT | Verase−Vy |
| $SGDx_1$ | Vss | Vcc | Vcc | Vss | Vcc | Vcc | FLOAT | Verase−Vy | Verase−Vy |
| $SGS_0$ | Vcc | Vss | Vcc | Vss | Vss | Vss | Verase−Vy | FLOAT | Verase−Vy |
| $SGS_1$ | Vss | Vcc | Vcc | Vss | Vss | Vss | FLOAT | Verase−Vy | Verase−Vy |
| BL_LO | Vcc | Vss | Vcc | Vcc | Vcc | Vcc | Vrease | Vss | Vrease |
| BL_UP | Vss | Vcc | Vcc | Vss | Vcc | Vcc | Vss | Vrease | Vrease |

MULTI-DECK MEMORY DEVICE WITH ACCESS LINE AND DATA LINE SEGREGATION BETWEEN DECKS AND METHOD OF OPERATION THEREOF

BACKGROUND

Memory devices are widely used in computers and many electronic items to store information. A memory device has numerous memory cells. The memory device performs a write operation to store information in the memory cells, a read operation to read the stored information, and an erase operation to erase information (e.g., obsolete information) from some or all of the memory cells the memory device. Memory cells in a memory device are usually organized in memory cell blocks. A memory device has access lines to access the memory cell blocks during a memory operation (e.g., read, write, or erase operation). A memory device also has data lines to carry information (e.g., in the form of signals) to be stored in or read from the memory cell blocks. However, some conventional memory devices have the access lines and data lines structured in ways that may affect the efficiency (e.g., throughput) of the memory device. Therefore, such conventional memory devices may be unsuitable for some applications.

BRIEF DESCRIPTION OF THE DRAWINGS

FIG. 8 is a chart showing example voltages applied to some signals of the memory device of FIG. 6 and FIG. 7 during read, write, and erase operations, according to some embodiments described herein.

FIG. 10 is a chart showing example voltages applied to some signals of the memory device of FIG. 9 during read, write, and erase operations, according to some embodiments described herein.

DETAILED DESCRIPTION

Figure 1:
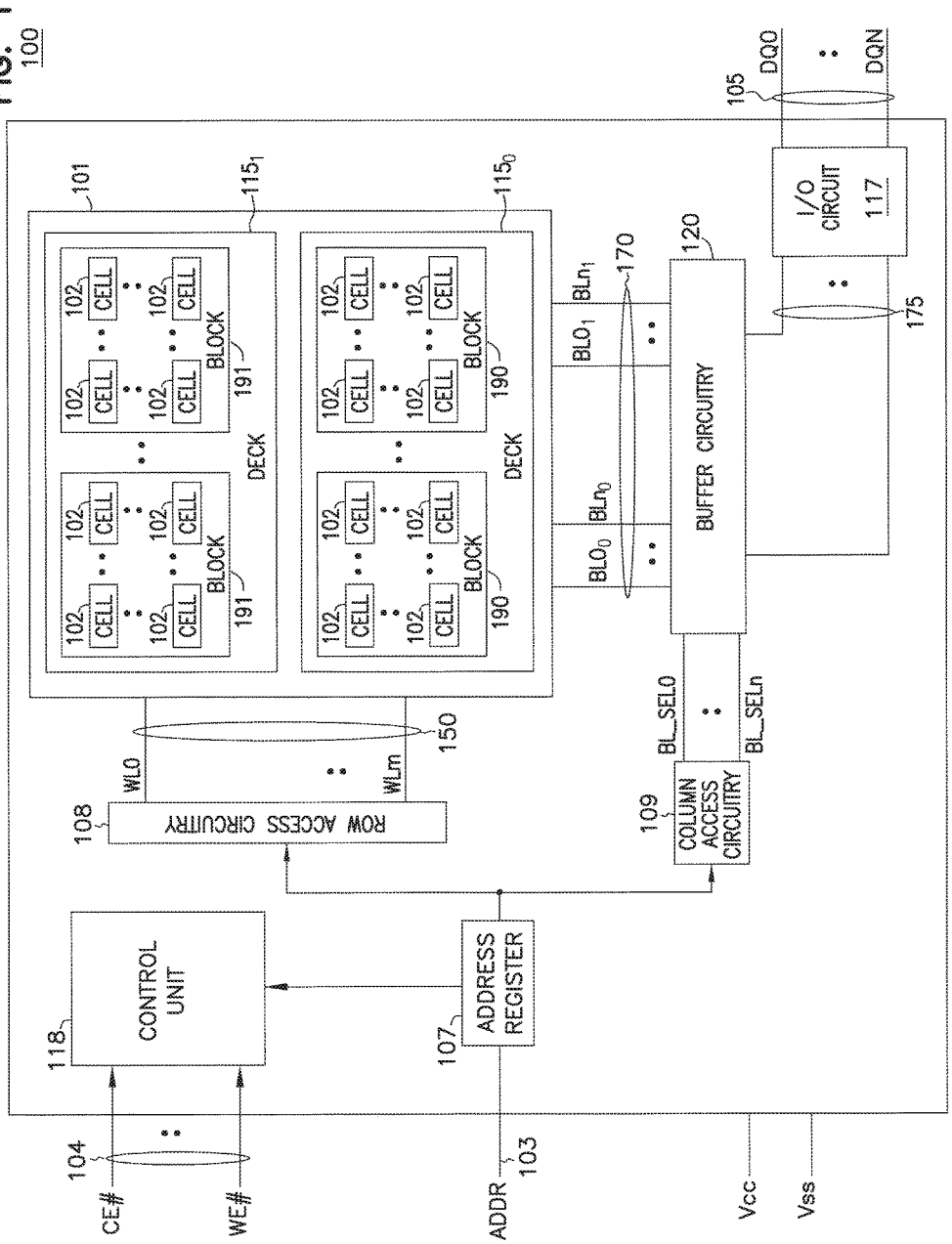
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a device portion 101 that includes a memory array (or multiple memory arrays) containing memory cells 102 arranged in decks, such as decks $115_0$ and $115_1$. In each of decks $115_0$ and $115_1$, memory cells 102 can be arranged in memory cell blocks, such as memory cell blocks 190 in decks $115_0$ and memory cell blocks 191 in decks $115_1$. In the physical structure of memory device 100, decks $115_0$ and $115_1$ can be arranged vertically (e.g., stacked over each other) over a substrate (e.g., a semiconductor substrate) of memory device 100. FIG. 1 shows memory device 100 having two decks $115_0$ and $115_1$ and two memory cell blocks 190 and 191 in each of the decks, respectively, as an example. Memory device 100 can have more than two decks of memory cells and more than two memory cell blocks in each of the decks.

As shown in FIG. 1, memory device 100 can include access lines 150 (which can include word lines) and data lines (e.g., local data lines) 170 (which can include bit lines). Access lines 150 can carry signals (e.g., word line signals) WL0 through WLm. Data lines 170 can carry signals (e.g., bit line signals) $BL0_0$ through $BLn_0$ and signals $BL0_1$ through $BLn_1$. Memory device 100 can use access lines 150 to selectively access memory cells 102 of decks $115_0$ and $115_1$ and data lines 170 to selectively exchange information (e.g., data) with memory cells 102 of decks $115_0$ and $115_1$.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of deck $115_0$, deck $115_1$, both decks $115_0$ and $115_1$ are to be accessed during a memory operation. Memory device 100 can perform a read operation to read (e.g., sense) information (e.g., previously stored information) in memory cells 102 of deck $115_0$, deck $115_1$, or both decks $115_0$ and $115_1$; or a write (e.g., programming) operation to store (e.g., program) information in memory cells 102 of deck $115_0$, deck $115_1$, or both decks $115_0$ and $115_1$. Memory device 100 can also perform an erase operation to erase information from some or all of memory cells 102 of deck $115_0$, deck $115_1$, or both decks $115_0$ and $115_1$.

Memory device 100 can use data lines 170 associated with signals $BL0_0$ through $BLn_0$ to provide information to be stored in memory cells 102 of deck $115_0$, or obtain information read (e.g., sensed) from memory cells 102 of deck $115_0$. Similarly, memory device 100 can use the same data lines 170 associated with signals $BL0_1$ through $BLn_1$ to provide information to be stored in memory cells 102 of deck $115_1$, or obtain information read (e.g., sensed) from memory cells 102 of deck $115_1$.

Memory device 100 can include a control unit 118 that can be configured to control memory operations of memory device 100 based on control signals on lines 104. Examples of the control signals on lines 104 include one or more clock signals and other signals (e.g., a chip enable signal CE#, a write enable signal WE#) to indicate which operation (e.g., read, write, or erase operation) memory device 100 can perform.

Memory device 100 can include buffer circuitry 120 that can include components such as sense amplifiers and page buffer circuits (e.g., data latches). Buffer circuitry 120 can respond to signals BL_SEL0 through BL_SELn from column access circuitry 109. Buffer circuitry 120 can be configured to determine (e.g., by sensing) the value of information read from memory cells 102 (e.g., during a read operation) of decks $115_0$ and $115_1$ and provide the value of the information in the form of signals $BL0_0$ through $BLn_0$ and signals $BL0_1$ through $BLn_1$ to lines (e.g., global data lines) 175. Buffer circuitry 120 can also can be configured to use signals on lines 175 to determine the value of information to be stored (e.g., programmed) in memory cells 102 of decks $115_0$ and $115_1$ (e.g., during a write operation) based on the values (e.g., voltage values) of signals on lines 175 (e.g., during a write operation).

Memory device 100 can include input/output (I/O) circuitry 117 to exchange information between of decks $115_0$ and $115_1$ and lines (e.g., I/O lines) 105. Signals DQ0 through DQN on lines 105 can represent information read from or stored in memory cells 102 of decks $115_0$ and $115_1$. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

Each of memory cells 102 can be programmed to store information representing a value of a fraction of a bit, a value of a single bit, or a value of multiple bits such as two, three, four, or another number of bits. For example, each of memory cells 102 can be programmed to store information representing a binary value "0" or "1" of a single bit. The single bit per cell is sometimes called a single level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3-dimensional (3-D)) NAND) or a NOR flash memory device, or another kind of memory device, such as a variable resistance memory device (e.g., a phase change memory device or a resistive RAM (Random Access Memory) device.

One of ordinary skill in the art may recognize that memory device 100 may include other components, several of which are not shown in FIG. 1 so as not to obscure the example embodiments described herein. At least a portion of memory device 100 can include structures and operations similar to or identical to any of the memory devices described below with reference to FIG. 2 through FIG. 10.

Figure 2:
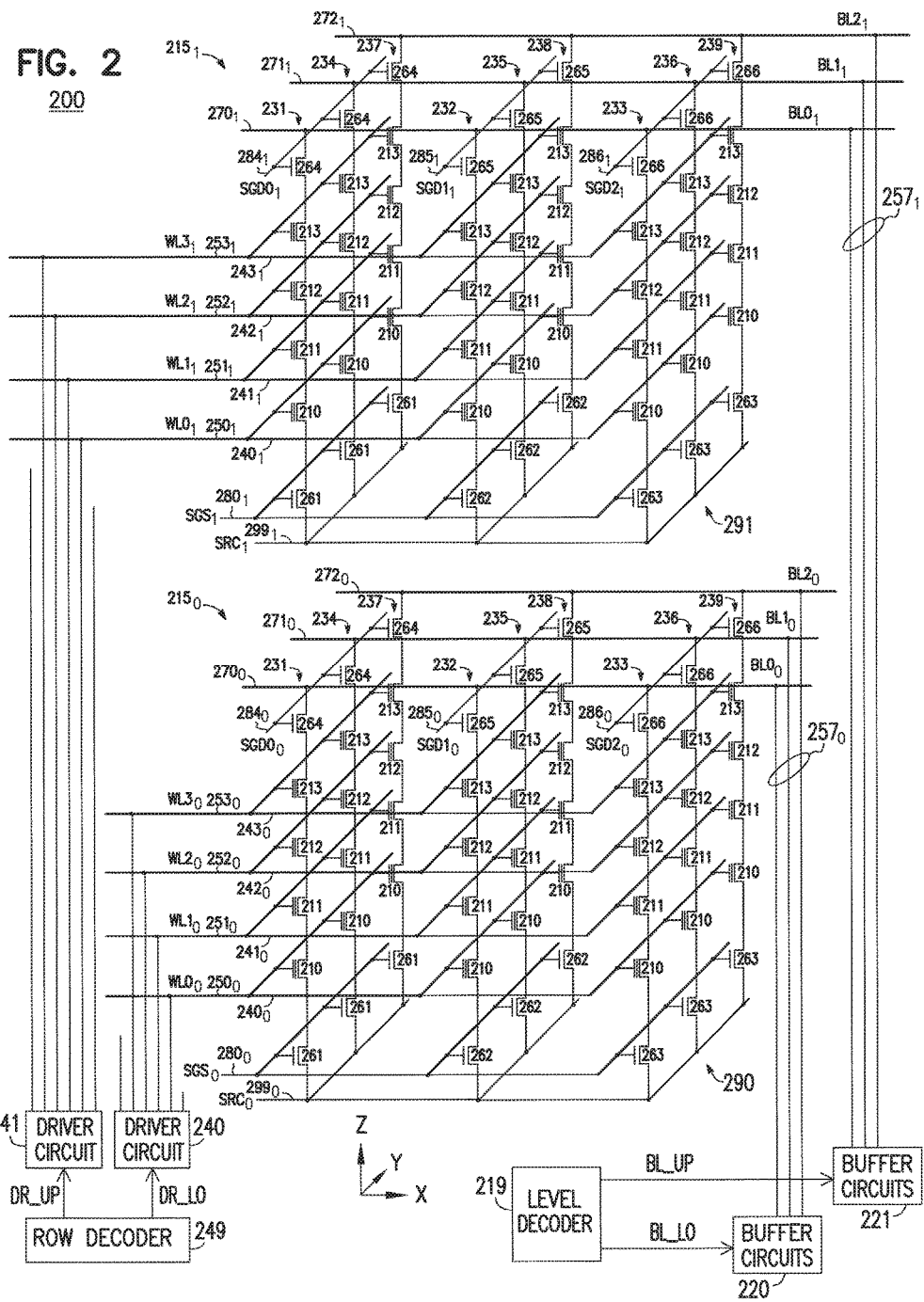
FIG. 2 shows a block diagram of a portion of a memory device including decks of memory cell strings, separate access lines between the decks, and separate data lines between the decks, according to some embodiments described herein.

FIG. 2 shows a block diagram of a portion of a memory device 200 including decks (decks of memory cell strings) $215_0$ and $215_1$, according to some embodiments described herein. Memory device 200 can correspond to memory device 100 of FIG. 1. For example, decks $215_0$ and $215_1$ can correspond to decks $115_0$ and $115_1$, respectively, of FIG. 1. FIG. 2 shows dimensions x, y, and z to indicate that, in the physical structure of memory device 200 (shown in FIG. 4 and FIG. 5 and described in detail below), decks $215_0$ and $215_1$ can be located (e.g., formed) in a z dimension (e.g., arranged vertically) over each other and over a substrate (e.g., a semiconductor substrate). The z-dimension is perpendicular to the x-dimension and y-dimension (perpendicular to an x-y plane).

As shown in FIG. 2, deck $215_0$ can include data lines $270_0$, $271_0$, and $272_0$ that carry signals (e.g., bit line signals) $BL0_0$, $BL1_0$, and $BL2_0$, respectively. Each of data lines $270_0$, $271_0$, and $272_0$ can be structured as a conductive line that can include a bit line of deck $215_0$. Deck $215_0$ can include access lines $250_0$, $251_0$, $252_0$, and $253_0$ that can carry corresponding signals (e.g., word line signals) $WL0_0$, $WL1_0$, $WL2_0$, and $WL3_0$. Each of access lines $250_1$, $251_1$, $252_1$, and $253_1$ can be structured as a conductive line that can include a word line of deck $215_0$. Deck $215_0$ can include control gates (e.g., memory cell control gates) $240_0$, $241_0$, $242_0$, and $243_0$ that can be coupled to (or part of) access lines $250_0$, $251_0$, $252_0$, and $253_0$, respectively.

Deck $215_1$ can include data lines $270_1$, $271_1$, and $272_1$ that carry signals (e.g., bit line signals) $BL0_1$, $BL1_1$, and $BL2_1$, respectively. Each of data lines $270_1$, $271_1$, and $272_1$ can be structured as a conductive line that can include a bit line of deck $215_1$. Deck $215_1$ can include access lines $250_1$, $251_1$, $252_1$, and $253_1$ that can carry corresponding signals (e.g., word line signals) $WL0_1$, $WL1_1$, $WL2_1$, and $WL3_1$. Each of access lines $250_1$, $251_1$, $252_1$, and $253_1$ can be structured as a conductive line that can include a word line of deck $215_1$. Deck $215_1$ can include control gates (e.g., memory cell control gates) $240_1$, $241_1$, $242_1$, and $243_1$ that can be coupled to (or part of) access lines $250_1$, $251_1$, $252_1$, and $253_1$, respectively.

FIG. 2 shows each of deck $215_0$ and $215_1$ including three data lines and four access lines (and four corresponding control gates) as an example. The number of data lines and access lines of decks $215_0$ and $215_1$ can vary.

As shown in FIG. 2, no deck among the decks (e.g., $215_0$ and $215_1$) of memory device 200 shares an access line (or access lines) of the access lines (e.g., $250_0$, $251_0$, $252_0$, $253_0$, $250_1$, $251_1$, $252_1$, and $253_1$) of memory device 200 with another deck among the decks of memory device 200. For example, decks $215_0$ and $215_1$ share no access line (do not share an access line or access lines) among access lines $250_0$, $251_0$, $252_0$, $253_0$, $250_1$, $251_1$, $252_1$, and $253_k$. Thus, memory cell blocks 290 and 291 share no access line (do not share an access line or access lines) among access lines $250_0$, $251_0$, $252_0$, $253_0$, $250_1$, $251_1$, $252_1$, and $253_1$.

As shown in FIG. 2, no deck among the decks (e.g., $215_0$ and $215_1$) of memory device 200 shares a data line (or data lines) of the data lines (e.g., $270_0$, $271_0$, $272_0$, $270_1$, $271_1$, and $272_1$) of memory device 200 with another deck among the decks of memory device 200. For example, decks $215_0$ and $215_1$ share no data line (do not share a data line or data lines) among data lines $270_0$, $271_0$, $272_0$, $270_1$, $271_1$, and $272_1$ and share no conductive path (do not share a conductive path or conductive paths) among conductive paths $257_0$ and $257_1$. Thus, no data line of data lines $270_0$, $271_0$, $272_0$, $270_1$, $271_1$, and $272_1$ is shared by memory cell blocks 290 and 291, and no conductive path of conductive paths $257_0$ and $257_1$ is shared by memory cell blocks 290 and 291.

As shown in FIG. 2, data lines $270_0$, $271_0$, and $272_0$ of deck $215_0$ are separated from and not coupled to (e.g., electrically unconnected to) data lines $270_1$, $271_1$, and $272_1$ of deck $215_1$. Thus, during a memory operation (e.g., read or write operation) performed (e.g., concurrently performed) on memory cells of deck $215_0$ and $215_1$, memory device 200 can use data lines $270_0$, $271_0$, and $272_0$ to carry information (e.g., information to be stored in or read from memory cells of deck $215_0$) that is different from information (e.g., to be stored in or read from memory cells of deck $215_1$) carried by data lines $270_1$, $271_1$, and $272_1$.

As shown in FIG. 2, access lines $250_0$, $251_0$, $252_0$, and $253_0$ of deck $215_0$ are separated from and not coupled to (e.g., electrically unconnected to) access lines $250_1$, $251_1$, $252_1$, and $253_1$ of deck $215_1$. Thus, during a memory operation (e.g., read, write, or erase operation), only one of decks $215_0$ and $215_1$ can be selected or both of decks $215_0$ and $215_1$ can be selected (e.g., concurrently selected). This allows memory device 200, during a memory operation (e.g., read, write, or erase operation), to access and operate on memory cells of only one of decks $215_0$ and $215_1$ or memory cells of both of decks $215_0$ and $215_1$.

As shown in FIG. 2, memory device 200 can include driver circuits 240 and 241, a row decoder 249, buffer circuits 220 and 221, a level decoder 219, conductive paths $257_0$ coupled to (e.g., coupled directly between) data lines $270_0$, $271_0$, and $272_0$ and buffer circuits 220, and conductive paths $257_1$ coupled to (e.g., coupled directly between) data lines $270_1$, $271_1$, and $272_1$ and buffer circuits 221. Conductive paths $257_0$ can be considered as part of data lines $270_0$, $271_0$, and $272_0$. Conductive paths $257_1$ can be considered as part of data lines $270_1$, $271_1$, and $272_1$.

Driver circuits 240 and 241 can be part of row access circuitry of memory device 200 that can correspond to row access circuitry 108 of FIG. 1. Buffer circuits 220 and 221 can be part of buffer circuitry of memory device 200 that can correspond to and operate in ways similar to (or the same as) buffer circuitry 120 of FIG. 1. For example, buffer circuits 220 can include sense amplifiers to sense information read from memory cells of memory cell block 290, and data latches store (e.g., temporarily store) one bit (or multiple bits) of information read from memory cells of memory cell block 290. Similarly, buffer circuit 221 can include sense amplifiers to sense information read from memory cells of memory cell block 291, and data latches to store (e.g., temporarily store) one bit (or multiple bits) of information read from memory cells of memory cell block 291.

Level decoder 219 can be part of column access circuitry of memory device 200 (that can correspond to column access circuitry 109 of FIG. 1). Level decoder 219 can operate to activate buffer circuits 220 and 221 to provide information to or receive information from memory cells through respective data lines of decks $215_0$ and $215_1$ (which are arranged in the "z" direction). Thus, level decoder 219 can be referred to as a "z" decoder.

As shown in FIG. 2, decks $215_0$ and $215_1$ have similar elements. Thus for simplicity, similar elements between decks $215_0$ and $215_1$ are given the same designation labels (e.g., reference numbers). The following description focuses on details of deck $215_0$. The elements of deck $215_1$ can have a similar description (which is not described in detail below for simplicity).

Deck $215_0$ includes memory cells 210, 211, 212, and 213, select transistors (e.g., source select transistors) 261, 262, and 263, and select transistors (e.g., drain select transistors) 264, 265, and 266. Memory cells 210, 211, 212, and 213 can be arranged in memory cell strings, such as memory cell strings 231 through 239. Deck $215_0$ can include a line $299_0$ that can carry a signal $SRC_0$ (e.g., source line signal). Line $299_0$ can be structured as a conductive line that can form part of a source (e.g., a source line) of deck $215_0$ memory device 200.

Each of memory cell strings 231 through 239 of deck $215_0$ can be coupled to one of data lines $270_0$, $271_0$, and $272_0$ through one of select transistors 264, 265, and 266. Each of memory cell strings 231 through 239 of deck $215_0$ can also be coupled to line $299_0$ through one of select transistors 261, 262, and 263. For example, memory cell string 231 can be coupled to data line $270_0$ through select transistor 264 (directly over string 231) and to line $299_0$ through select transistor 261 (directly under string 231). In another example, memory cell string 232 can be coupled to data line $270_0$ through select transistor 265 (directly over string 232) and to line $299_0$ through transistor 262 (directly under string 232). FIG. 2 shows an example of nine memory cell strings 231 through 239 and four memory cells 210, 211, 212, and 213 in each memory cell string. However, the number of memory cell strings and the number of memory cells in each memory cell string of deck $215_0$ can vary. Further, one skilled in the art would recognize that some of the memory cells among memory cells 210, 211, 212, and 213 of memory cell strings 231 through 239 may be configured as dummy memory cells. Dummy memory cells are not configured to store information. Dummy memory cells may be configured for purposes known to those skilled in the art. In some examples of memory device 200, dummy memory cells may include one or two (or more than two) memory cells at the two ends of each of memory cell strings 231 through 239. For example, in FIG. 2, dummy memory cells can include a memory cell (or memory cells) immediately next to each of select transistors 261, 262, and 263, and/or a memory cell (or memory cells) immediately next to each of select transistors 264, 265, and 266.

As shown in FIG. 2, some memory cells (e.g., 213) of different memory cell strings (e.g., 231 through 239) can be controlled by the same control gate (e.g., $243_0$) and can be coupled to the same access line (e.g., $253_0$). Some other memory cells (e.g., 212) of these memory cell strings (e.g., 231 through 239) can be controlled by another control gate (e.g., $242_0$). Each of control gates $240_0$, $241_0$, $242_0$, and $243_0$ can be structured as a single conductive plate (shown in FIG. 4 and FIG. 5). During a memory operation of memory device 200, control gates $240_0$, $241_0$, $242_0$, and $243_0$ can receive respective signals $WL0_0$, $WL1_0$, $WL2_0$, and $WL3_0$ (through respective access lines $250_0$, $251_0$, $252_0$, and $253_0$) to access memory cells 210, 211, 212, and 213 of selected memory cell strings.

As shown in FIG. 2, select transistors 261, 262, and 263 of deck $215_0$ can be coupled to a select line (e.g., source select line) $280_0$. Select transistors 261, 262, and 263 of deck $215_0$ can be controlled (e.g., turned on or turned off) by the same signal, such as an $SGS_0$ signal (e.g., source select gate signal) applied to select line $280_0$. During a memory operation, such as a read or write operation, select transistors 261, 262, and 263 of deck $215_0$ can be turned on (e.g., by activating $SGS_0$ signal) to couple memory cell strings 231 through 239 of deck $215_0$ to line $299_0$. Select transistors 261, 262, and 263 of deck $215_0$ can be turned off (e.g., by deactivating the $SGS_0$ signal) to decouple memory cell strings 231 through 239 of deck $215_0$ from line $299_0$.

Select transistors 264, 265, and 266 of deck $215_0$ can be coupled to select lines (e.g., drain select lines) $284_0$, $285_0$, and $286_0$, respectively. Select transistors 264, 265, and 266 of deck $215_0$ can be controlled (e.g., turned on or turned off) by corresponding signals $SGD0_0$, $SGD1_0$, $SGD2_0$ (e.g., drain select gate signals). During a memory operation (e.g., a read or write operation) select transistors 264, 265, and 266 of deck $215_0$ can be selectively turned on (e.g., by selectively activating signals $SGD0_0$, $SGD1_0$, $SGD2_0$) to selectively couple the memory cell strings of deck $215_0$ to their respective data lines $270_0$, $271_0$, and $272_0$. Select transistors 264, 265, and 266 of deck $215_0$ can be selectively turned off (e.g., by selectively deactivating signals $SGD0_0$, $SGD1_0$, $SGD2_0$) to selectively decouple the memory cell strings of deck $215_0$ from their respective data lines $270_0$, $271_0$, and $272_0$.

During a memory operation (e.g., a read or write operation), only one of the signals $SGD0_0$, $SGD1_0$, $SGD2_0$ can be activated at a time (e.g., the signals will be sequentially activated). For example, during a read operation to read (e.g., sense) information from memory cell strings 231, 234, and 237, signal $SGD0_0$ can be activated to turn on transistors 264 of deck $215_0$ and couple memory cell strings 231, 234, and 237 of deck $215_0$ to data lines $270_0$, $271_0$, and $272_0$, respectively. In this example, signals $SGD1_0$ and $SGD2_0$ can be deactivated (while signal $SGD0_0$ is activated) to decouple memory cell strings 232, 235, 238, 233, 236, and 239 of deck $215_0$ from data lines $270_0$, $271_0$, and $272_0$. In another example, during a read operation to read information from memory cell strings 232, 235, and 238, signal $SGD1_0$ can be activated to turn on transistors 265 and couple memory cell strings 232, 235, and 238 to data lines $270_0$, $271_0$, and $272_0$, respectively. Signals $SGD0_0$ and $SGD2_0$ can be deactivated (while signal $SGD1_0$ is activated) to decouple memory cell strings 231, 234, 237, 233, 236, and 239 from data lines $270_0$, $271_0$, and $272_0$.

As mentioned above, deck $215_1$ includes elements similar to those of deck $215_0$. For example, as shown in FIG. 2, deck $215_1$ can include memory cell strings 231 through 239, select transistors 261, 262, 263, 264, 265, and 266, select line (e.g., source select line) $280_1$ and corresponding signal $SGS_1$ (e.g., source select gate signal), line $299_1$ (e.g., source line) and corresponding signal $SRC_1$ (e.g., source line signal), select lines (e.g., drain select lines) $284_1$, $285_1$, and $286_1$ and corresponding signals $SGD0_1$, $SGD1_1$, $SGD2_1$ (e.g., drain select gate signals).

Each of decks $215_0$ and $215_1$ can include memory cell blocks in which each of the memory cell blocks includes memory strings. For example, deck $215_0$ can include memory cell block 290, which includes memory cell strings 231 through 239 in deck $215_0$, and deck $215_1$ can include memory cell block 291, which includes memory cell strings 231 through 239 in deck $215_1$. Memory cell block 290 can correspond to one of memory cell blocks 190 of FIG. 1. Memory cell block 291 can correspond to one of memory cell blocks 191 of FIG. 1. For simplicity, only one memory cell block 290 of deck $215_0$ and only one memory cell block 291 of deck $215_1$ are shown in FIG. 2. Further, FIG. 2 shows each of memory cell blocks 290 and 291 including nine memory cell strings (e.g., 231 through 239) as an example. The number of memory cell strings in memory cell blocks 290 and 291 can vary.

A memory cell block (e.g., 290 or 291) of a memory device (e.g., 200) described herein is a group of memory cells (e.g., 210, 211, 212, and 213) in which fewer than all of the memory cells (or alternatively all of the memory cells) in the group of memory cells (memory cell block) can be selected as selected memory cells to store information in (e.g., in a write operation) or read information from (e.g., in a read operation) the selected memory cells. However, fewer than all of the memory cells in the group of memory cells (e.g., only memory cells have stored information) may not be selected as selected memory cells to erase information from the selected memory cells (e.g., in an erase operation). In an erase operation, all of the memory cells in the group of memory cells (memory cell block) are selected (e.g., automatically selected) even if some of the memory cells in the group of memory cells are available to store information (e.g., some of the memory cells in the group of memory cells have no stored information before the erase operation). Thus, a memory cell block includes memory cells in which fewer than all of the memory cells (or alternatively all of the memory cells) can be selected during a read or write operation. However, in an erase operation, all of the memory cells in the memory cell block (memory cells in entire memory cell block) are selected.

Memory cell block 290 can include a unique block address (block-level address) within deck $215_0$. Memory cell block 291 can include a unique block address (block-level address) within deck $215_1$. However, memory cell blocks 290 and 291 may include the same block address (same block-level address). For example, memory cell block 290 may include a block address BK-29 (for example) that is unique among block addresses of memory cell blocks of deck $215_0$, and memory cell block 291 may also include block address BK-29 but that is unique among block addresses of memory cell blocks of deck $215_1$. Decks $215_0$ and $215_1$ have different deck addresses (deck-level addresses). During a memory operation (e.g., read, write, or erase operation), only one of memory cell blocks 290 and 291 or both memory cell blocks 290 and 291 can be selected based on block-level address and deck-level address. Since memory cell blocks 290 and 291 may have the same block address, memory cell blocks 290 and 291 can be concurrently selected during a memory operation based on an address information. This may simplify row access circuitry, column access circuitry, both row and column access circuitry of memory device 200.

Memory device 200 can include different modes of operations, including a single deck mode and multi-deck (e.g., double deck) mode. Memory device may perform a single deck operation in the single deck mode and a multi-deck (e.g., double deck) operation in the multi-deck mode. Address information received by memory device 200 during a particular memory operation can be decoded to determine whether that particular mode of operation is single deck mode (in order to perform a single deck operation) or multi-deck mode (in order to perform a multi-deck operation). Memory device 200 can include an address register (not shown in FIG. 2, but it can be similar to address register 107 of FIG. 1) to receive address information. Decoding of the address information (e.g., decoded by row decoder 249) can provide information for single deck operation or multi-deck operation.

In a single deck operation, one of decks $215_0$ and $215_1$ can be selected (e.g., accessed) while the other deck may not be selected (e.g., unselected or not accessed). For example, in a single deck operation, memory cell block 290 of decks $215_0$ can be selected to access and operate on memory cells in block 290 while memory cell block 291 of deck $215_1$ is unselected, such that memory cells in memory cell block 291 may not be accessed. As an example, in a single deck operation (e.g., performed in the single deck mode) memory device 200 can operate to establish (to form) circuit paths (e.g., current paths) between data lines $270_0$, $271_0$, and $272_0$ of memory cell block 290 and buffer circuits 220 (e.g., through conductive paths $257_0$) if memory cell block 290 is selected during a memory operation (e.g., read or write operation) to access memory cells (e.g., selected memory cells of selected memory cell strings) of memory cell block 290. In this example, memory cell block 291 can be unselected. Thus, memory device 200 may establish no circuit paths (e.g., establish no current paths) between data lines $270_1$, $271_1$, and $272_1$ of memory cell block 291 and buffer circuits 221.

In a multi-deck operation, decks $215_0$ and $215_1$ can be concurrently selected (e.g., concurrently accessed). For example, in a multi-deck operation, memory cell blocks 290 and 291 can be concurrently selected to access and operate on memory cells in memory cell blocks 290 and 291. As an example, in a multi deck operation (e.g., performed in the multi-deck mode) where memory cell blocks 290 and 291 are selected (e.g., concurrently selected in the same read operation or the same write operation), memory device 200 can operate to establish circuit paths (e.g., current paths) between data lines $270_0$, $271_0$, and $272_0$ of memory cell block 290 and buffer circuits 220 (e.g., through conductive paths $257_0$). In this example, memory device 200 can also establish circuit paths (e.g., current paths) between data lines $270_1$, $271_1$, and $272_1$ of memory cell block 291 and buffer circuits 221 (e.g., through conductive paths $257_1$).

Row decoder 249 can operate to decode address information (from an address register of memory device 200) to obtain decoded row address information. A particular operation of memory device 200 can be a single deck operation or a multi-deck operation based on the decoded row address information. Row decoder 249 can operate to activate only one of driver circuits 240 and 241 (e.g., to access and operate on memory cells of only one of memory cell blocks 290 and 291) if the operation is a single deck operation. Row decoder 249 can operate to activate both driver circuits 240 and 241 (e.g., to access and operate on memory cells in of both memory cell blocks 290 and 291) if the operation is a multi-deck operation.

Memory device 200 may provide control information (e.g., commands) to level decoder 219 based on address information. Such control information can include information for a single deck operation or multi-deck operation. Level decoder 219 can decode such control information in order to activate buffer circuits 220 and 221 accordingly. For example, if the operation is a single deck operation (e.g., based on only one of the addresses of deck $215_0$ and deck $215_1$ being decoded), level decoder 219 can operate to activate only one of buffer circuits 220 and 221. If the operation is a multi-deck operation (e.g., based on the addresses of both of decks $215_0$ and $215_1$ being decoded), level decoder 219 can operate to activate both buffer circuits 220 and 221.

The following description gives different examples for single and multi-deck operations. In an example of a single deck operation (e.g., read, write, or erase operation) of memory device 200, memory cell block 290 of deck $215_0$ can be selected while memory cell block 291 of deck $215_1$ is unselected (not selected). Thus, in this example, memory device 200 may not operate on memory cells 210, 211, 212, and 213 of memory cell block 291. Memory device 200 may operate on memory cells 210, 211, 212, and 213 of memory cell block 290 to store information in selected memory cells of memory cell block 290 (e.g., if the operation is a write operation), read information from selected memory cells of memory cell block 290 (e.g., if the operation is a read operation), or erase information from selected memory cells (e.g., all of memory cells) of memory cell block 290 (e.g., if the operation is an erase operation). In this example, row decoder 249 can activate driver circuit 240 (e.g., by activating signal DR_LO) and may not activate driver circuits 241 (e.g., by not activating (e.g., deactivating) signal DR_UP). Thus, selected memory cell strings of deck $215_0$ are accessed and memory cell strings of deck $215_1$ are not accessed. Level decoder 219 can activate buffer circuits 220 (e.g., by activating signal BL_LO) and may not activate buffer circuits 221 (e.g., by not activating (e.g., deactivating) signal BL_UP). Then, information can be stored in memory cell block 290 (if the operation is a write operation) or read from memory cell block 290 (if the operation is a read operation) of deck $215_0$ using buffer circuits 220 (the activated buffer circuits in this example), conductive paths $257_0$, and data lines $270_0$, $271_0$, and $272_0$.

In another example of a single deck operation (e.g., read, write, or erase operation), deck $215_1$ can be selected while deck $215_0$ is unselected. Thus, in this example, row decoder 249 can activate driver circuit 241 (e.g., by activating signal DR_UP) and may not activate driver circuit 240 (e.g., by not activating (e.g., deactivating) signal DR_LO). Level decoder 219 can activate buffer circuits 221 (e.g., by activating signal BL_UP) and may deactivate buffer circuits 220 (e.g., by not activating (e.g., deactivating) signal BL_LO). Then, information can be stored in memory cell block 291 (if the operation is a write operation) or read from memory cell block 291 (if the operation is a read operation) of deck $215_1$ using buffer circuits 221 (the activated buffer circuits in this example), conductive paths $257_1$, and data lines $270_1$, $271_1$, and $272_1$.

In an example of a multi-deck deck operation, memory cell blocks 290 and 291 of decks $215_0$ and $215_1$ can be concurrently selected (e.g., selected at the same time based on the same block address) to operate on memory cells 210, 211, 212, and 213 of memory cell blocks 290 and 291. In this example, memory device 200 may access and operate on memory cells 210, 211, 212, and 213 of memory cell blocks 290 and 291 to store information in selected memory cells of memory cell blocks 290 and 291 (e.g., if the operation is a write operation), read information from selected memory cells of memory cell blocks 290 and 291 (e.g., if the operation is a read operation), or erase information from selected memory cells (e.g., all of memory cells) of memory cell blocks 290 and 291 (e.g., if the operation is an erase operation). In this example (e.g., in a read or write operation), row decoder 249 can activate (e.g., concurrently activate) driver circuits 240 and 241 (e.g., by concurrently activating signals DR_LO and DR_UP). Level decoder 219 can activate (e.g., concurrently activate) buffer circuits 220 and 221 (e.g., by concurrently activating signals BL_LO and BL_UP (which can be based on deck address being decoded). Then, information (e.g., different information) can be concurrently provided to memory cell blocks 290 and 291 (to be stored in selected memory cells in memory cell blocks 290 and 291) or concurrently read from memory cell blocks 290 and 291 using respective buffer circuits (220 and 221), respective conductive paths ($257_0$ and $257_1$), and respective data lines ($270_0$, $271_0$, $272_0$, $270_1$, $271_1$, and $272_1$) associated with memory cell blocks 290 and 291.

Thus, as described above, memory device 200 can include separate data lines for different decks (e.g., data lines $270_0$, $271_0$, and $272_0$ for deck $215_0$, and data lines $270_1$, $271_1$, and $272_1$ for deck $215_1$), separate (e.g., dedicated) driver circuits for different decks (e.g., driver circuits 240 and 241 for decks $215_0$ and $215_1$, respectively), and separate (e.g., dedicated) buffer circuits for different decks (e.g., buffer circuits 220 and 221 for decks $215_0$ and $215_1$, respectively). The elements and operations of memory device 200, as described above, may allow it to have improvements over some conventional memory devices. For example, throughput (e.g., for read, write, and erase operation) of memory device 200 can be higher than throughput of some conventional memory devices. As an example, in comparison with some conventional memory devices, throughput of memory device 200 can be two times higher (double) if memory device 200 includes two decks (e.g., $215_0$ and $215_1$), four times higher (quadruple) if memory device 200 includes four decks, or eight times higher if memory device 200 includes eight decks. Further, in comparison with some conventional memory devices, including separate driver circuits (e.g., 240 and 241) for different decks (e.g., $215_0$ and $215_1$) along with separate data lines for different decks in memory device 200 may allow it to have a lower capacitance (e.g., coupling capacitance) and a smaller block size (lower storage capacity for each memory cell block).

Figure 3:
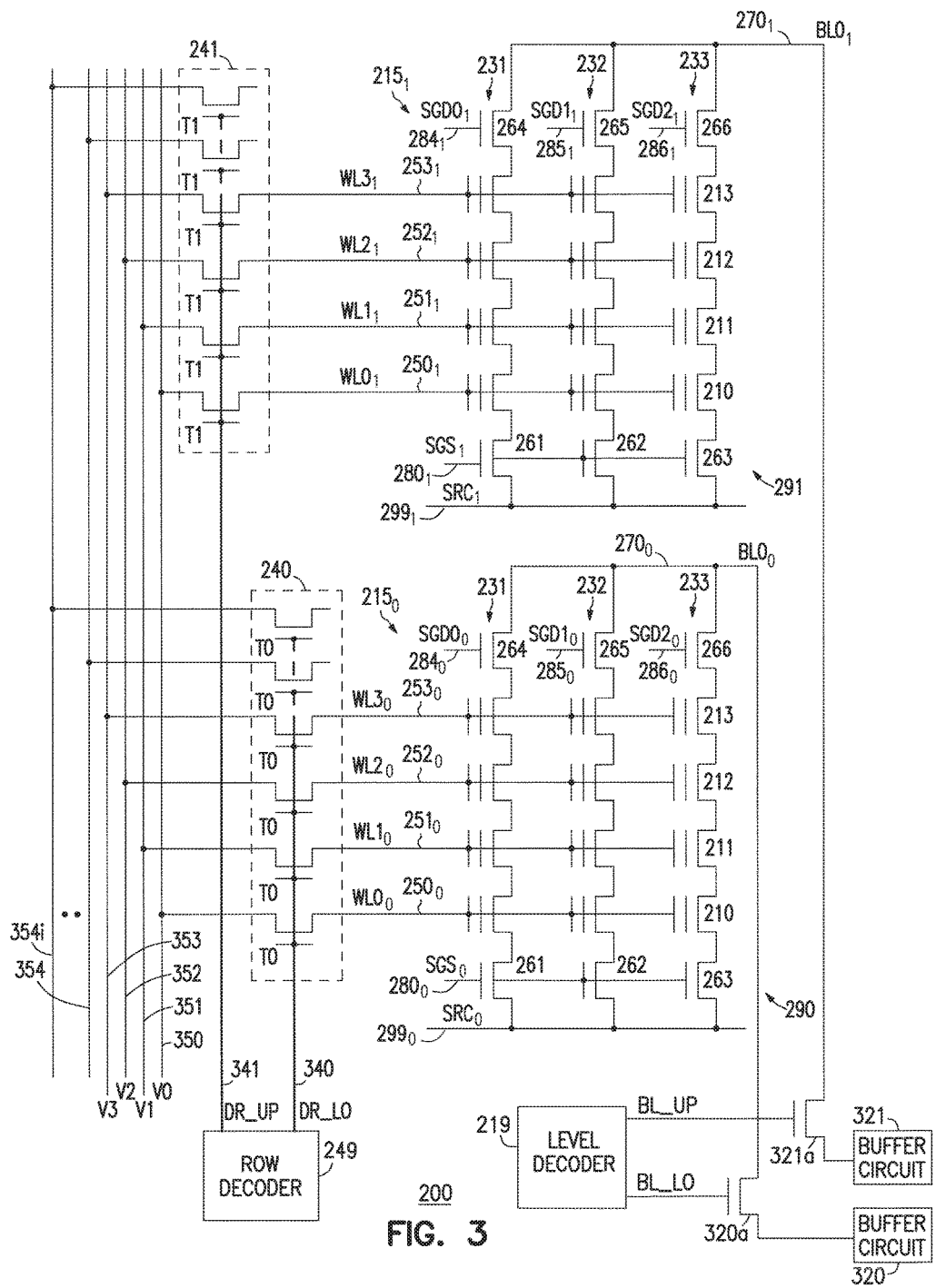
FIG. 3 shows a schematic diagram of a portion of the memory device of FIG. 2 including details of driver circuits and buffer circuits of the memory device of FIG. 2, according to some embodiments described herein.

FIG. 3 shows a schematic diagram of a portion of the memory device 200 of FIG. 2 including details of driver circuits 240 and 241 of FIG. 2 and buffer circuits 220 and 221 of FIG. 2, according to some embodiments described herein. As shown in FIG. 3, driver circuit 240 can include transistors (e.g., high-voltage drive transistor) T0. Transistors T0 can have a transistor gate 340 (e.g., a common gate, which is common to transistors T0). Thus, transistors T0 can be controlled (e.g., turned on at the same time or turned off at the same time) using the same transistor gate (e.g., transistor gate 340). Driver circuit 241 can include transistors (e.g., high-voltage drive transistor) T1. Transistors T1 can have a transistor gate 341 (e.g., a common gate, which is common to transistors T1 and different from transistor gate 340). Thus, transistors T1 can be controlled (e.g., turned on at the same time or turned off at the same time) using the same transistor gate (e.g., transistor gate 341).

Memory device 200 can include conductive lines 350, 351, 352, 353, and 354 through 354$i$, each of which can carry a signal (e.g., voltage signal, which is different from a data signal). As an example, conductive lines 350, 351, 352, and 353 can carry signals (e.g., voltage signal) V0, V1, V2, and V3, respectively.

As shown in FIG. 3, some (e.g., four) of transistors T0 can be coupled between conductive lines 350, 351, 352, and 353 and access lines $250_0$, $251_0$, $252_0$, and $253_0$, respectively. Some (e.g., four) of transistors T1 can be coupled between conductive lines 350, 351, 352, and 353 and access lines $250_1$, $251_1$, $252_1$, and $253_1$, respectively.

For simplicity, FIG. 3 omits connections (conductive connections) between some elements of deck $215_0$ and conductive lines 354 through 354$i$. Such connections include connections between conductive lines 354 through 354$i$ and select line (e.g., source select line) $280_0$, select lines (e.g., drain select lines) $284_0$, $285_0$, and $286_0$, and line (e.g., source line) $299_0$ of deck $215_0$. Similarly, for simplicity, FIG. 3 omits connections (conductive connections) between some elements of deck $215_1$ and conductive lines 354 through 354$i$. Such connections include connections between conductive lines 354 through 354$i$ and select line (e.g., source select line) $280_1$, select lines (e.g., drain select lines) $284_1$, $285_1$, and $286_1$, and line (e.g., source line) $299_1$ of deck $215_1$.

Driver circuit 240 can use transistors T0 to provide (e.g., drive) signals from conductive lines 350, 351, 352, 353, and 354 through 354$i$ to respective elements of deck $215_0$. For example, driver circuit 240 can use four of transistors T0 to provide signals V0, V1, V2, and V3 from four corresponding conductive lines 350, 351, 352, and 353 to four access lines $250_0$, $251_0$, $252_0$, and $253_0$, respectively.

Driver circuit 241 can use transistors T1 to provide (e.g., drive) signals from conductive lines 350, 351, 352, 353, and 354 through 354$i$ to respective elements of deck $215_1$. For example, driver circuit 241 can use four of transistors T1 to provide signals V0, V1, V2, and V3 from four corresponding conductive lines 350, 351, 352, and 353 to four access lines $250_1$, $251_1$, $252_1$, and $253_1$, respectively, of deck $215_1$.

As shown in FIG. 3, transistor gates 340 and 341 are separate from each other. Thus, driver circuits 240 and 241 can separately use transistor gates 340 and 341 (e.g., separately activate respective signals DR_LO and DR_UP) to control (e.g., turn on or turn off) transistors T0 and T1. For example, during a single deck operation of memory device 200, if deck $215_0$ is selected to be accessed (to operate on memory cells 210, 211, 212, and 213 of memory cell block 290) and deck $215_1$ is not selected to be accessed, then signal DR_LO can be activated (e.g., by row decoder 249) while signal DR_UP is not activated (e.g., deactivated). In this example, transistors T0 can be turned on while transistors T1 are turned off in order to establish circuit paths (e.g., current paths) between access lines $250_0$, $251_0$, $252_0$, and $253_0$ of memory cell block 290 and conductive lines 350, 351, 352, and 353 (e.g., through transistors T0). This allows signals V0, V1, V2, and V3 to be applied to access lines $250_0$, $251_0$, $252_0$, and $253_0$, respectively, (through turned-on transistors T0). In this example, memory device 200 may establish no circuit paths (e.g., establish no current paths) between access lines $250_1$, $251_1$, $252_1$, and $253_1$ of memory cell block 291 and conductive lines 350, 351, 352, and 353 (because transistors T1 are turned off). Thus, in this example, signals V0, V1, V2, and V3 are not applied to access lines $250_1$, $251_1$, $252_1$, and $253_1$.

In another example, during another single deck operation of memory device 200, if deck $215_1$ is selected to be accessed (to operate on memory cells 210, 211, 212, and 213 of memory cell blocks 291) and deck $215_0$ is not selected to be accessed, then signal DRL_UP can be activated (e.g., by decoder 249) while signal DR_LO is not activated (e.g., deactivated). In this example, transistors T1 can be turned on while transistors T0 are turned off. This allows signals V0, V1, V2, and V3 to be applied to access lines $250_1$, $251_1$, $252_1$, and $253_1$ respectively (through turned-on transistors T1). In this example, signals V0, V1, V2, and V3 are not applied to access lines $250_0$, $251_0$, $252_0$, and $253_0$ because transistors T0 are turned off.

In an example multi-deck operation of memory device 200 where both decks $215_0$ and $215_1$ are selected to be accessed (to operate on memory cells 210, 211, 212, and 213 of memory cell blocks 290 and 291), signals DR_LO and DRL_UP can be activated (e.g., by decoder 249). In this example, transistors T0 and T1 are turned on (e.g., concurrently turned on). This allows signals V0, V1, V2, and V3 to be applied to access lines $250_0$, $251_0$, $252_0$, and $253_0$, respectively, and to access lines $250_1$, $251_1$, $252_1$, and $253_1$ because transistors T0 and T1 are turned on.

As shown in FIG. 3, memory device 200 can include a buffer circuit 320, a buffer circuit 321, and transistors 320$a$ and 321$a$. Buffer circuit 320 and transistor 320$a$ can be part of buffer circuits 221 of FIG. 2. Buffer circuit 321 and transistor 321$a$ can be part of buffer circuits 220 of FIG. 2. Buffer circuit 320 can include transistors (inside buffer circuit 320) that can be part of a sense amplifier of buffer circuit 320 (to sense information read from memory cells of memory cell strings 231, 232, and 233 of memory cell block 290) and part of a data latch of buffer circuit 320 to store (e.g., temporarily store) one bit (or multiple bits) of information read from memory cells of memory cell strings 231, 232, and 233 of memory cell block 290. Similarly, buffer circuit 321 can include transistors (inside buffer circuit 321) that can be part of a sense amplifier of buffer circuit 321 (to sense information read from memory cells of memory cell strings 231, 232, and 233 of memory cell block 291) and part of a data latch of buffer circuit 321 to store (e.g., temporarily store) one bit (or multiple bits) of information read from memory cells of memory cell strings 231, 232, and 233 of memory cell block 291.

As shown in FIG. 3, data lines $270_0$ and $270_1$ can be coupled to respective buffer circuits (e.g., 320 and 321) through different transistors (e.g., 320a and 321a). This allows level decoder 219 to selectively activate signals BL_LO and BL_UP in order to selectively couple data lines $270_0$ and $270_1$ to their respective buffer circuits 320 and 321, depending on the mode of operation (e.g., single deck or multi-deck mode) of memory device 200.

For example, in a single deck operation of memory device 200, if deck $215_0$ is selected to be accessed (to operate on memory cells 210, 211, 212, and 213 of memory cell block 290) and deck $215_1$ is not selected to be accessed, then signal BL_LO can be activated (e.g., by level decoder 219) while signal BL_UP is not activated (e.g., deactivated). In this example, transistor 320a can be turned on while transistor 321a is turned off. This allows data line $270_0$ to be coupled to buffer circuit 320 through turned-on transistor 320a. Then, information can be stored in or read from memory cell block 290 of deck $215_0$ using buffer circuit 320 (the activated buffer circuit in this example). In this example, data line $270_1$ is not coupled to buffer circuit 321 because transistor 321a is turned off.

In another example of a single deck operation of memory device 200, if deck $215_1$ is selected to be accessed (to operate on memory cells 210, 211, 212, and 213 of memory cell block 291) and deck $215_0$ is not selected to be accessed, then signal BL_UP can be activated (e.g., by level decoder 219) while signal BL_LO is not activated (e.g., deactivated). In this example, transistor 321a can be turned on while transistor 320a is turned off. This allows data line $270_1$ to be coupled to buffer circuit 321 through turned-on transistor 321a. Then, information can be stored in or read from memory cell block 291 of deck $215_1$ using buffer circuit 321 (the activated buffer circuit in this example). In this example, data line $270_0$ is not coupled to buffer circuit 320 because transistor 320a is turned off.

In an example multi-deck operation of memory device 200 where both decks $215_0$ and $215_1$ are selected to be accessed (to operate on memory cells 210, 211, 212, and 213 of memory cell blocks 290 and 291), signals DR_LO and DRL_UP can be activated (e.g., concurrently activated by level decoder 219). In this example, transistors 320a and 321a can be concurrently turned on. This allows data lines $270_0$ and $270_1$ to be coupled (e.g., concurrently coupled) to buffer circuits 320 and 321, respectively, through turned-on transistors 320a and 321a, respectively. Then, information can be currently provided to decks $215_0$ and $215_1$ (to be stored in respective memory cells of memory cell blocks 290 and 291) using corresponding buffer circuits 320 and 321, or information can be concurrently read from memory cell blocks 290 and 291 using corresponding buffer circuits 320 and 321.

As shown in FIG. 3, data lines $270_0$ and $270_1$ can be coupled to respective buffer circuits (e.g., 320 and 321) through different transistors (e.g., 320a and 321a). This allows level decoder 219 to selectively activate signals BL_LO and BL_UP in order to selectively couple data lines $270_0$ and $270_1$ to their respective buffer circuits 320 and 321, depending on the mode of operation (e.g., single deck or multi-deck mode) of memory device 200.

FIG. 3 shows buffer circuits (e.g., 320 and 321) and transistors (e.g., 320a and 321a) for data line $270_0$ of deck $215_0$ of data line $270_1$ of deck $215_1$. However, memory device 200 also have a buffer circuit (similar to buffer circuit 320 and or 321) and a transistor (similar to transistor 320a or 321a) for each of the other lines (e.g., data lines $271_0$ and $272_0$ in FIG. 2) of deck $215_0$ and each of the other lines (e.g., data lines $271_1$ and $272_1$ in FIG. 2) of deck $215_1$.

The elements and operations of memory device 200 of FIG. 3 may allow it to have improvements (e.g., a higher throughput, a smaller block size, and a lower capacitance) over some conventional memory devices, as mentioned above with reference the description of FIG. 2.

Figure 4:
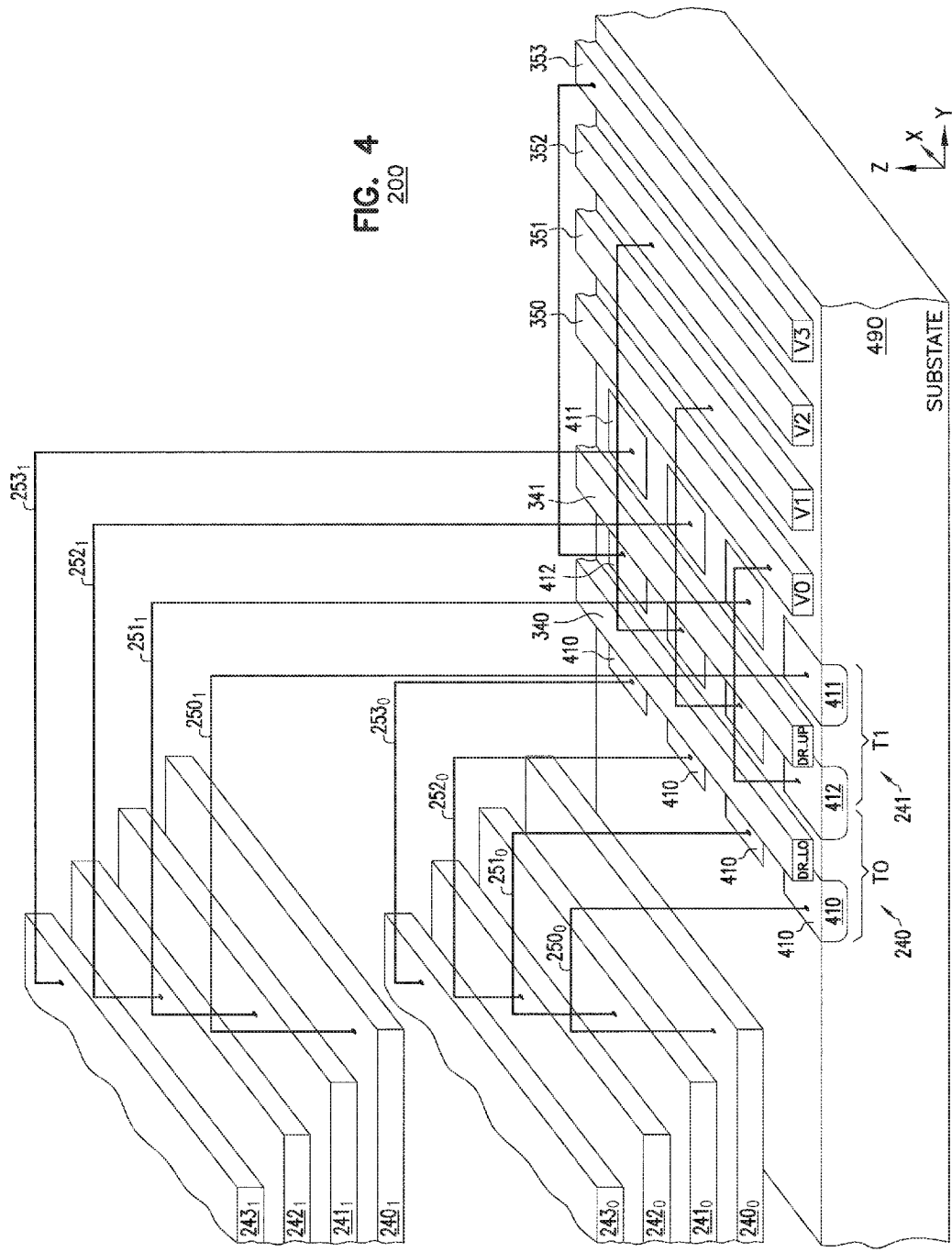
FIG. 4 shows a layout of a portion of the memory device of FIG. 2, according to some embodiments described herein.

FIG. 4 shows a layout of a portion of the memory device of FIG. 2, according to some embodiments described herein. As shown in FIG. 4, memory device 200 can include a substrate 490, doped regions 410, 411, and 412 formed in substrate 490. Substrate 490 can include a monocrystalline (also referred to as single-crystal) semiconductor material (e.g., single-crystal silicon). The monocrystalline semiconductor material of substrate 490 can include impurities, such that substrate 490 can have a specific conductivity type (e.g., p-type).

Doped regions 410, 411, and 412 and substrate 490 and can include materials of different conductivity types. For example, substrate 490 can include a semiconductor material of p-type, and each of doped regions 410, 411, and 412 can include a semiconductor material of n-type.

Doped regions 410 and 412 can be sources and drains of transistors T0 of driver circuit 240, such that one of doped regions 410 and one of doped regions 412 can be the source and drain of one of transistors T0. Doped regions 411 and 412 can be sources and drains of transistors T1 of driver circuit 241, such that one of doped regions 411 and one of doped regions 412 can be the source and drain of one of transistors T1.

As shown in FIG. 4, transistor gate 340 can be located over a location (e.g., transistor channels of transistors T0) between doped regions 410 and 412. Transistor gate 341 can be located over a location (e.g., transistor channels of transistors T1) between doped regions 411 and 412. Each of transistor gates 340 and 341 can have a length extending in an x-dimension (which is perpendicular to the y and z dimensions). Each of conductive lines 350, 351, 352, and 353 in FIG. 4 can have a length extending in the same direction as each of transistor gates 340 and 341.

Control gates $240_0$, $241_0$, $242_0$, and $243_0$ can be formed as conductive plates and can have a staircase structure. Control gates $240_0$, $241_0$, $242_0$, and $243_0$ can be coupled to respective doped regions 410 of driver circuit 240 through respective access lines $250_0$, $251_0$, $252_0$, and $253_0$. Control gates $240_1$, $241_1$, $242_1$, and $243_1$ can be coupled to respective doped regions 411 of driver circuit 241 through respective access lines $250_1$, $251_1$, $252_1$, and $253_1$.

FIG. 4, shows access lines $250_0$, $251_0$, $252_0$, $253_0$, $250_1$, $251_1$, $252_1$, and $253_1$ being simple lines for simplicity. In reality, each of these access lines has a length, a width, and a thickness relative to the x, y, and z dimensions. Similarly, FIG. 4 shows conductive connections between doped regions 412 and respective conductive lines 350, 351, 352, and 353 as simple lines for simplicity. In reality, each of these conductive connections has a length, a width, and a thickness relative to the x, y, and z dimensions.

As shown in FIG. 4, transistor gates 340 and 341 are physically separated from each other. This allows memory device 200 to selectively activate signals DR-LO and DR_UP to selectively couple access lines $250_0$, $251_0$, $252_0$, and $253_0$ (and control gates $240_0$, $241_0$, $242_0$, and $243_0$) and access lines $250_1$, $251_1$, $252_1$, and $253_1$ (and control gates $240_1$, $241_1$, $242_1$, and $243_1$) to respective conductive lines 350, 351, 352, and 353 (to receive corresponding signals V0, V1, V2, and V3), depending on the mode of operation (e.g., single deck or multi-deck mode), as described above with reference to FIG. 2 and FIG. 3.

Figure 5:
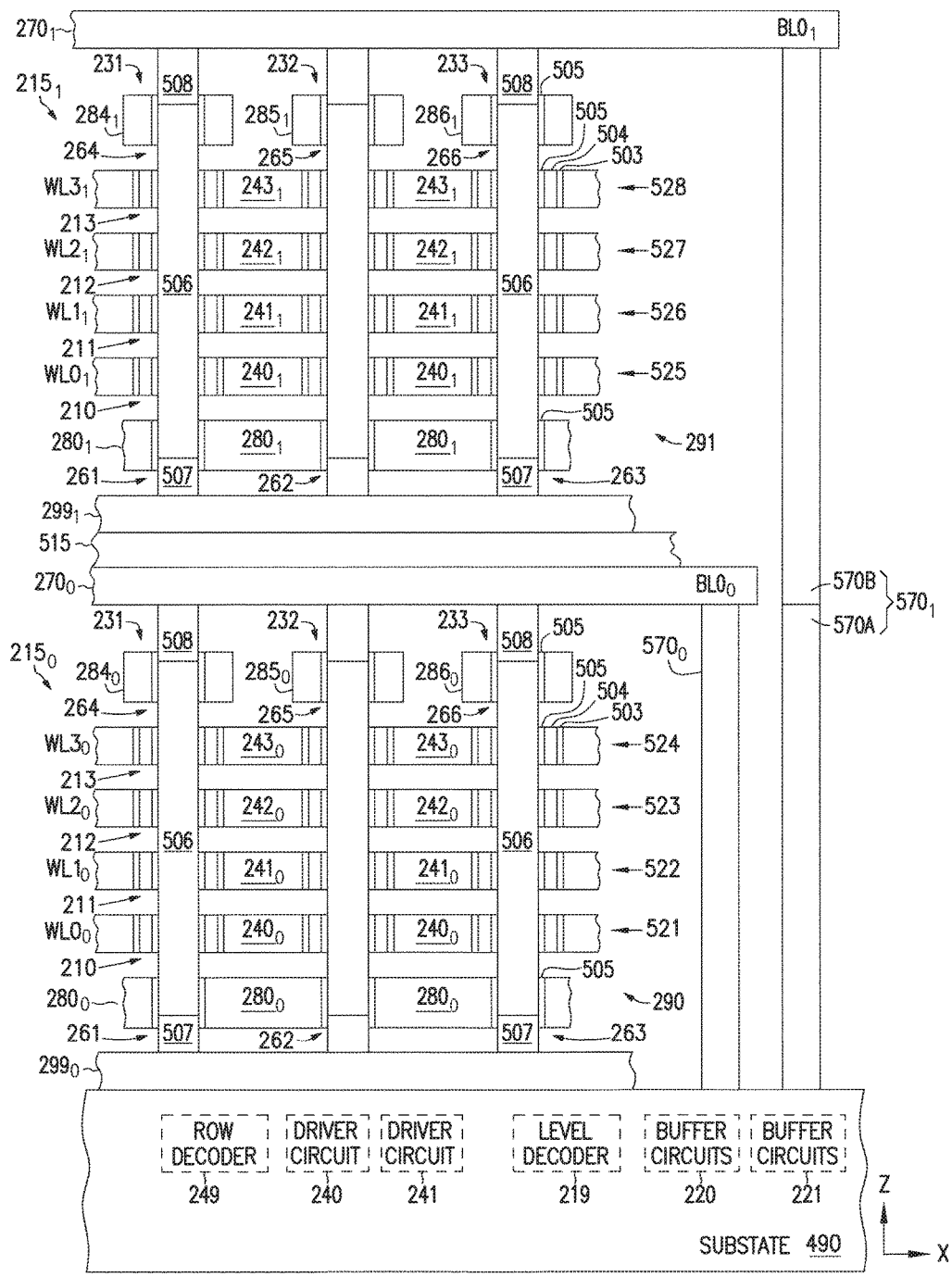
FIG. 5 shows a side view of a structure of a portion of the memory device of FIG. 2, according to some embodiments described herein.

FIG. 5 shows a side view of a structure of a portion of memory device 200 of FIG. 2, according to some embodiments described herein. As shown in FIG. 5, row decoder 249, driver circuits 240 and 241, level decoder 219, and buffer circuits 220 and 221 can be located in (e.g., formed in or formed on) substrate 490. In an alternative structure, some or all of row decoder 249, driver circuits 240 and 241, level decoder 219, and buffer circuits 220 and 221 can be located outside substrate 490 (e.g., formed over substrate 490, such as formed in one or more of levels 521 through 528). Thus, in an alternative structure, at least a portion of buffer circuits 220 and 221 (only part of buffer circuits 220 and 221 or the entire buffer circuits 220 and 221) can be formed outside substrate 490.

As shown in FIG. 5, deck $215_0$ can be located (e.g., formed) over substrate 490 in the z-dimension. Deck $215_1$ can be located over deck $215_0$ (e.g., stacked over deck $215_0$). Memory device 200 can include a dielectric material 515 (e.g., electrical insulating material) between decks $215_0$ and $215_1$. In each of decks $215_0$ and $215_1$, memory cell strings 231, 232, and 233 can be arranged in the x-dimension, which is perpendicular to the z-dimension. Each of data line $270_0$ and $270_1$ can have a length extending in the x-dimension.

Memory cells 210, 211, 212, and 213 of deck $215_0$ can be located in different levels 521, 522, 523, and 524, respectively, of memory device 200 in the z-dimension. Memory cells 210, 211, 212, and 213 of deck $215_1$ can be respectively located in different levels 525, 526, 527, and 528 of memory device 200 in the z-dimension.

As shown in FIG. 5, each of memory cell strings 231, 232, and 233 of decks $215_0$ and $215_1$ can include a pillar (e.g., a vertical body perpendicular to substrate 490) formed by pillar portions 506, 507, and 508 between a respective data line ($270_0$ or $270_1$) and a respective line (e.g., source) $299_0$ or $299_1$. The pillar can be configured to provide a conduction of current (e.g., to form a conductive channel) between the respective data line ($270_0$ or $270_1$) and a respective source (line $299_0$ or $299_1$). Pillar portions 506 and each of pillar portions 507 and 508 can include materials of different conductivity types. For example, pillar portion 506 can include a semiconductor material of p-type, and each of pillar portions 507 and 508 can include a semiconductor material of n-type. The semiconductor material can include polycrystalline silicon (polysilicon).

In deck $215_0$, control gates $240_0$, $241_0$, $242_0$, and $243_0$ can be located along respective segments of pillar portion 506 of a pillar of a respective memory cell string among memory cell strings 231, 232, and 233. Control gates $240_0$, $241_0$, $242_0$, and $243_0$ can be located in the z-dimension in the same levels (e.g., 521, 522, 523, and 524) where memory cells 210, 211, 212, and 213 of deck $215_0$ are located.

Similarly, in deck $215_1$, control gates $240_1$, $241_1$, $242_1$, and $243_1$ can be located along respective segments of pillar portion 506 of a pillar of a respective memory cell string among memory cell strings 231, 232, and 233. Control gates $240_1$, $241_1$, $242_1$, and $243_1$ can be located in the z-dimension in the same levels (e.g., 525, 526, 527, and 528) where memory cells 210, 211, 212, and 213 of deck $215_1$ are located. Each of control gates $240_0$, $241_0$, $242_0$, $243_0$, $240_1$, $241_1$, $242_1$, and $243_1$ can include a conductive material (e.g., conductively doped polycrystalline silicon or other conductive material).

Each of decks $215_0$ and $215_1$ can include materials 503, 504, and 505. For simplicity, the following description focuses on materials 503, 504, and 505 in deck $215_0$. Deck $215_1$ has similar arrangement for materials 503, 504, and 505.

In deck $215_0$, material 505 can be formed between a pillar (formed by pillar portions 506, 507, and 508) of a corresponding memory cell string (231, 232, or 233) and select line (e.g., source select line) $280_0$. Material 505 can be formed between a pillar (formed by pillar portions 506, 507, and 508) of a corresponding memory cell string (231, 232, or 233) and each of select lines (e.g., drain select lines) $284_0$, $285_0$, and $286_0$. Material 505 can be used as a gate oxide for each of select transistors (e.g., source select transistors) 261, 262, and 263, and each of select transistors (e.g., drain select transistors) 264, 265, and 266.

The combination of materials 503, 504, 505 in deck $215_0$ can be formed between pillar portion 506 of a corresponding pillar and each of control gates $240_0$, $241_0$, $242_0$, and $243_0$. The combination of materials 503, 504, 505 can form part of the structure of a memory cell (e.g., memory cell 210, 211, 212, or 213) of deck $215_0$. For example, the combination of materials 503, 504, and 505 can be part of a TANOS (TaN, $Al_2O_3$, $Si_3N_4$, $SiO_2$, Si) structure of each of memory cells 210, 211, 212, and 213 of deck $215_0$ and deck $215_1$. In this example, material 503 (e.g., interpoly dielectrics) can include a charge-blocking material or materials (e.g., a dielectric material such as TaN and $Al_2O$) that is capable of blocking a tunneling of a charge. Material 504 can include a charge storage element (e.g., charge storage material or materials, such as $Si_3N_4$) that can provide a charge storage function (e.g., trap charge) to represent a value of information stored in memory cells 210, 211, 212, or 213. Material 505 can include a tunnel dielectric material or materials (e.g., $SiO_2$) that is capable of allowing tunneling of a charge (e.g., electrons). As an example, material 505 can allow tunneling of electrons from pillar portion 506 to material 504 during a write operation and tunneling of electrons from material 504 to pillar portion 506 during an erase operation of memory device 200. Moreover, material 505 can allow tunneling of holes from pillar portion 506 to portion 504, compensating the trapped electron's recombination during an erase operation of memory device 200.

In another example, the combination of materials 503, 504, and 505 can be part of a SONOS (Si, $SiO_2$, $Si3N_4$, $SiO_2$, Si) structure of each of memory cells 210, 211, 212, and 213) of deck $215_0$ and deck $215_1$. In a further example, the combination of materials 503, 504, and 505 can be part of a floating gate structure of each of memory cells 210, 211, 212, and 213 of deck $215_0$ and deck $215_1$.

As shown in FIG. 5, data line $270_0$ can be coupled (e.g., directly coupled) to buffer circuit 220 through (e.g., directly through) a conductive path $570_0$, which is included in one of conductive paths $257_0$ (FIG. 2). Conductive path $570_0$ can be considered as part of data line $270_0$, such that the material of conductive path $570_0$ can directly contacts the material of data line $270_0$. Data line $270_1$ can be coupled (e.g., directly coupled) to buffer circuit 221 through (e.g., directly through) a conductive path $570_1$, which includes portions 570A and 570B. Conductive path $570_1$ is included in one of conductive paths $257_1$ (FIG. 2). Conductive path $570_1$ can be considered as part of data line $270_1$, such that the material of conductive path $570_1$ can directly contacts the material of data line $270_1$. Each of conductive paths $570_0$ and $570_1$ can include a conductive material (or conductive materials) that is located (e.g., formed) over substrate 490, such as conductively doped polycrystalline silicon, metal, or other conductive materials. Portions 570A and 570B can be formed either at the same time (e.g., in the same deposition process) or at different times (e.g., in different deposition processes).

Portion 570A can be formed (e.g., formed in a process) before Portion 570B is formed (e.g., formed in another process). For example, portion 570A can be formed when conductive path $570_0$ is formed (e.g., when deck $215_0$ is formed), then portion 570B can be formed (e.g., formed when deck $215_1$ is formed) after conductive path $570_0$ and portion 570A are formed.

As shown in FIG. 5, conductive paths $570_0$ and $570_1$ are physically separated from each other (e.g., electrically unconnected to each other), and data lines $270_0$ and $270_1$ are separately coupled to buffer circuits 220 and 221 through conductive paths $570_0$ and $570_1$, respectively. Thus, conductive paths $570_0$ and $570_1$ are not shared by memory cell blocks 290 and 291. This allows memory device 200 to operate in either a single deck operation or multi-deck operation, as described above with reference to FIG. 2, FIG. 3, and FIG. 4.

Each of other data lines ($271_0$ and $272_0$) of deck $215_0$ and data lines (e.g., $271_1$ and $272_1$) of deck $215_1$ also includes a conductive path similar to conductive paths $570_0$ and $570_1$. For example, memory device 200 can include two conductive paths (similar to conductive path $570_0$) coupled to respective data lines $271_0$ and $272_0$ and two conductive paths (similar to conductive path $570_1$) coupled to respective data lines $271_1$ and $272_1$.

Figure 6:
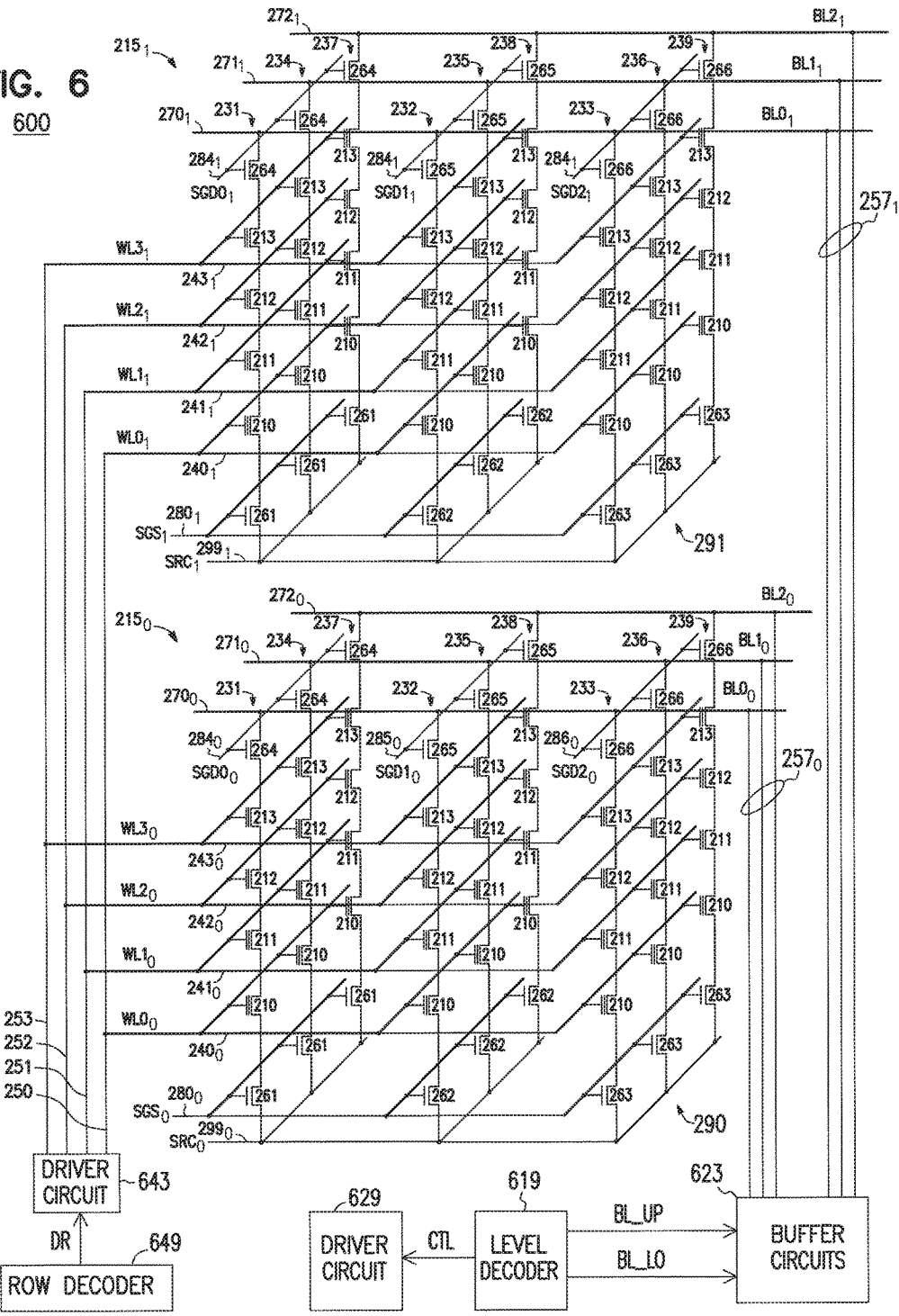
FIG. 6 shows a schematic diagram of a memory device including decks memory cell strings, shared access lines between the decks, and separate data lines between the decks, according to some embodiments described herein.

FIG. 6 shows a schematic diagram of a memory device 600 including multiple decks having shared access lines 250, 251, 252, and 253, and separate data lines $270_0$, $271_0$, $272_0$, $270_1$, $271_1$, and $272_1$, according to some embodiments described herein. As shown in FIG. 6, memory device 600 can include elements similar to those of memory elements of memory device 200 of FIG. 2. Thus, for simplicity, similar or identical elements are given the same designation labels and their descriptions are not repeated here.

As shown in FIG. 6, memory device 600 can include a row decoder 649, a driver circuit 643, a level decoder 619, a driver circuit (e.g., a level driver circuit) 629, and buffer circuits 623. Decks $215_0$ and $215_1$ access lines 250, 251, 252, and 253. Thus, memory cell blocks 290 and 291 share access lines 250, 251, 252, and 253. Memory device 600 can use driver circuit 643 to access both decks $215_0$ and $215_1$ through access lines 250, 251, 252, and 253. Row decoder 649 can generate a signal DR to control driver circuit 643. Level decoder 619 can generate signals BL-LO and BL_UP (to control buffer circuits 623) and information (e.g., signals) CTL to control driver circuit 629. Driver circuits 629 can be used to provide (e.g., drive) signals (e.g., voltage signals) to respective select lines $280_0$ and $280_1$ and lines (e.g., sources) $299_0$ and $299_1$.

Figure 7:
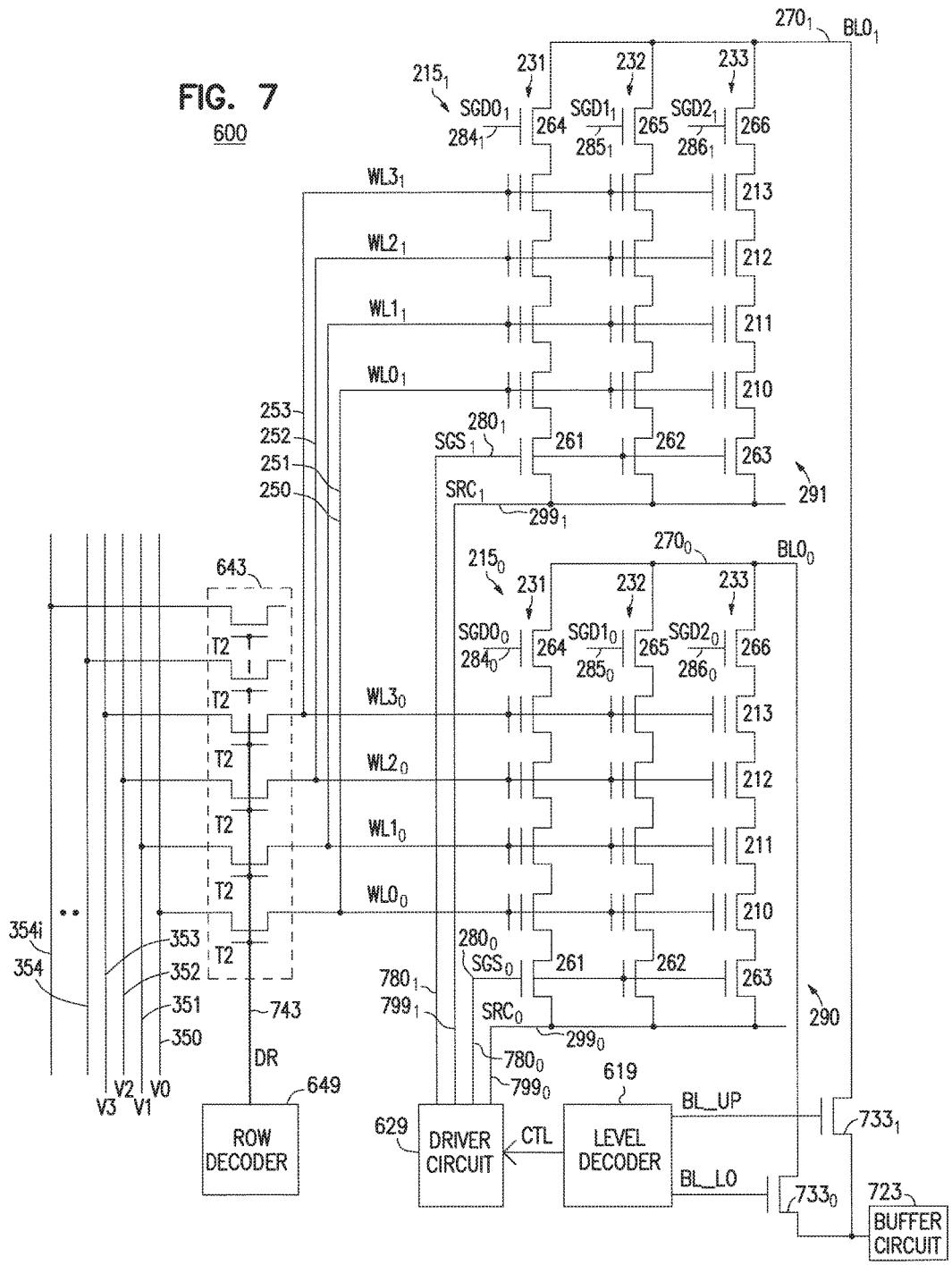
FIG. 7 shows a schematic diagram of a portion of the memory device of FIG. 6 including details of a driver circuit and buffer circuits of the memory device of FIG. 6, according to some embodiments described herein.

FIG. 7 shows a schematic diagram of a portion of memory device 600 of FIG. 6 including details of driver circuit 643 and buffer circuits 623 of FIG. 6, according to some embodiments described herein. As shown in FIG. 7, driver circuit 643 can include transistors (e.g., high-voltage drive transistor) T2. Transistors T2 can have a transistor gate 743 (e.g., a common gate, which is common to drive transistors T2). Thus, transistors T2 can be controlled (e.g., turned on at the same time or turned off at the same time) using the same transistor gate (e.g., transistor gate 743).

Conductive lines 350, 351, 352, 353, and 354 through 354*i* (and signals V0, V1, V2, and V3) are similar to those described above with reference to FIG. 3. As shown in FIG. 7, some (e.g., four) of transistors T2 can be coupled between conductive lines 350, 351, 352, and 353 and access lines 250, 251, 252, and 253, respectively. For simplicity, FIG. 7 omits connections (conductive connections) between some elements of deck $215_0$ and conductive lines 354 through 354*i*. Such connections include connections between conductive lines 354 through 354*i* and select lines (e.g., drain select lines) $284_0$, $285_0$, $286_0$, $284_1$, $285_1$, and $286_1$.

Driver circuit 643 can use transistors T2 to provide (e.g., drive) signals from conductive lines 350, 351, 352, 353, and 354 through 354*i* to respective elements of decks $215_0$ and $215_1$. For example, driver circuit 643 can use four of transistors T2 to provide signals V0, V1, V2, and V3 from four corresponding conductive lines 350, 351, 352, and 353 to four access lines 250, 251, 252, and 253, respectively.

During a memory operation of memory device 600, when either deck $215_0$ or deck $215_1$ is selected to be accessed, driver circuit 643 can activate signal DR to turn on transistors T2. This allows signals V0, V1, V2, and V3 to be applied to access lines 250, 251, 252, and 253, respectively (through turned-on transistors T2). Memory device 600 can operate on memory cells of the selected deck (e.g., either deck $215_0$ or $251_1$) to store information in or read information from selected memory cells of the selected deck (e.g., if the operation is a write or read operation), or erase information from selected memory cells (e.g., all of memory cells) of memory cell block 290 (e.g., if the operation is an erase operation).

As shown in FIG. 7, memory device 200 can include a buffer circuit 723, and transistors $733_0$ and $733_k$. Buffer circuit 723 and transistors $733_0$ and $733_1$ can be part of buffer circuits 623 of FIG. 6. Data lines $270_0$ and $270_1$ can be coupled to buffer circuit 723 through transistors $733_0$ and $733_1$, respectively.

Driver circuits 629 can include transistors (e.g., high-voltage drive transistors, not shown in FIG. 7) similar to transistors T2 in order to control the values (e.g., voltage values) of signals (e.g., voltage signals) provided to select lines $280_0$ and $280_1$ and lines (e.g., sources) $299_0$ and $299_1$ during operations of memory device 600.

Memory device 600 may provide control information (e.g., commands) to level decoder 619 based on address information received during a memory operation (e.g., read, write, or erase operation) of memory device 600. Level decoder 619 can decode such control information in order to selectively activate signals BL_LO and BL_UP to selectively turn on transistors $733_0$ and $733_1$. Level decoder 619 can also provide information CTL to driver circuit 629, such that driver circuit 629 can control the values of signals provided to select lines $280_0$ and $280_1$ and lines $299_0$ and $299_1$ during operations of memory device 600 (described in more detail below with reference to FIG. 8).

In FIG. 7, as an example, if memory cell block 290 of deck $215_0$ is selected and memory cell block 291 of deck $215_1$ is unselected (not selected), row decoder 649 can activate driver circuit 643 (e.g., by activating signal DR) to access memory cells 210, 211, 212, and 213 of selected memory cell strings of memory cell block 290. Level decoder 619 can activate signal BL_LO (and not activate signal BL_UP) to turn on transistor $733_0$ in order to couple data line $270_0$ to buffer circuit 723. In this example, level decoder 619 may not activate signal BL_UP to keep off (or turn off) transistor $733_1$ while transistor $733_0$ is turned on, thereby not coupling data line $270_1$ to buffer circuit 723 while data line $270_0$ is coupled to buffer circuit 723. Then, information can be stored in or read from memory cell block 290 of deck $215_0$ using buffer circuit 723.

In FIG. 7, as another example, if memory cell block 291 of deck $215_0$ is selected and memory cell block 290 of deck $215_0$ is unselected (not selected), row decoder 649 can activate driver circuit 643 (e.g., by activating signal DR) to access memory cells 210, 211, 212, and 213 of selected memory cell strings of memory cell block 291. Level decoder 619 can activate signal BL_UP (and not activate signal BL_LO) to turn on transistor $733_1$ in order to couple data line $270_1$ to buffer circuit 723. In this example, level decoder 619 may not activate signal BL_LO to keep off (or turn off) transistor $733_0$ while transistor $733_1$ is turned on, thereby not coupling data line $270_0$ to buffer circuit 723 while data line $270_1$ is coupled to buffer circuit 723. Then, information can be stored in or read from memory cell block 291 of deck $215_1$ using buffer circuit 723.

In the above examples of accessing memory cells of either deck $215_0$ or $215_1$, information CTL can have values to cause driver circuit 629 to provide select lines $280_0$ and $280_1$ with different voltages and lines $299_0$ and $299_1$ with different voltages (e.g., voltages shown in FIG. 8). Some other signals of decks $215_0$ and $215_1$ can also be provided with voltage shown in FIG. 8.

In FIG. 7, driver circuits 629 can include transistors (e.g., high-voltage drive transistors, not shown in FIG. 7) similar to transistors T2 in order to control the values (e.g., voltage values) of signals (e.g., voltage signals) applied to select lines $280_0$ and $280_1$ and lines (e.g., sources) $299_0$ and $299_1$ during operations of memory device 600.

As shown in FIG. 7, memory device 600 can conductive paths $780_0$ and $780_1$ coupled to select lines (e.g., source select lines) $280_0$ and $280_1$, respectively. Conductive paths $780_0$ and $780_1$ are coupled to driver circuit 629. Conductive paths $780_0$ and $780_1$ are separate from each other (e.g., electrically unconnected to each other). Thus, during a memory operation (e.g., read, write, or erase operation) of memory device 600, driver circuit 629 can provide (e.g., apply) signals $SGS_0$ and $SGS_1$ with voltages having different values (e.g., as shown in chart 600A of FIG. 8), depending on which of decks $215_0$ and $215_1$ is selected. For example, during a memory operation of memory device 600, driver circuit 629 can couple line $280_0$ to a conductive line (not shown in FIG. 6) through a transistor (not shown in FIG. 6) and line $280_1$ to another conductive line (not shown in FIG. 6) through another transistor (not shown in FIG. 6). The conductive lines (that are coupled to lines $280_0$ and $280_1$ through the transistors in driver circuit 629) in this example can be provided with voltages having different values.

As shown in FIG. 7, memory device 600 can include conductive paths $799_0$ and $799_1$ are coupled to lines (e.g., sources) $299_0$ and $299_1$, respectively. Conductive paths $799_0$ and $799_1$ are coupled to driver circuit 629. Conductive paths $799_0$ and $799_1$ are separate (e.g., electrically uncoupled) from each other. Thus, during a memory operation (e.g., read, write, or erase operation) of memory device 600, driver circuit 629 can provide (e.g., apply) signals $SRC_0$ and $SRC_1$ with voltages having different values (e.g., as shown in chart 600A of FIG. 8), depending on which of decks $215_0$ and $215_1$ is selected. For example, during a memory operation of memory device 600, driver circuit 629 can couple line $299_0$ to a conductive line (not shown in FIG. 6) through a transistor (not shown in FIG. 6) and line $299_1$ to another conductive line (not shown in FIG. 6) through another transistor (not shown in FIG. 6). The conductive lines (that are coupled to lines $299_0$ and $299_1$ through the transistors in driver circuit 629) in this example can be provided with voltages having different values.

FIG. 8 is a chart 600A showing example voltages applied to some signals of memory device 600 in FIG. 6 and FIG. 7 during read, write, and erase operations of memory device 600, according to some embodiments described herein.

Some of the signals of memory device 600 in FIG. 6 and FIG. 7 (e.g., $WL0_0$, $WL1_0$, $WL2_0$, $WL3_0$, $WL0_1$, $WL1_1$, $WL2_1$, and $WL3_1$) are omitted from FIG. 8 for simplicity. The omitted signals can be provided with voltages known to those skilled in the art. In FIG. 8, for simplicity, the signal ($BL0_0$) from only one of data lines $270_0$, $271_0$, and $272_0$) and the signal ($BL0_1$) from only one of data lines $270_1$, $271_1$, and $272_1$) are shown.

Voltage Vss in FIG. 8 can have a value of 0V (e.g., ground potential). Voltage Vcc can be a supply voltage of memory device 600 (FIG. 6 and FIG. 7). Voltage Vbl can have a value (e.g., either a pre-charge voltage value or a sensed value) depending on the value of information stored in the selected memory cell. Voltage Verase can have relatively high value (e.g., 20V) to allow erasing of information stored in memory cell of a selected memory cell block (e.g., 290 or 291 in FIG. 6). Voltage Vy can have a relatively low value (e.g., 3V to 5V). In FIG. 8, "FLOAT" indicates a state (e.g., a "float state") situation where a particular conductive line (or signal on that particular conducive line) is decoupled from a bias voltage (decoupled from direct current (DC) voltage source). This decoupling allows the value of the voltage of that particular conductive line (or signal on that particular conducive line) to vary. For example, in a read operation in FIG. 8 when deck $215_0$ is selected, line $299_1$ (that carry signal $SRC_1$) deck $215_1$ (unselected deck) can be placed in a float state. In this example, information CTL may be provided with a value to cause driver circuit 629 in FIG. 7 to turn off a transistor (in driver circuit 629) coupled between line $299_0$ and a conductive line (not shown in FIG. 7) that is used to provide a voltage to line $299_1$ (through driver circuit 629) if deck $215_1$ is selected.

As shown in FIG. 8, either deck $215_0$ or deck $215_1$ can be selected in a read, write, or erase operation to operate on memory cells 210, 211, 212, and 213 of selected memory cell strings of memory cell block 290 or 291. However, in an erase operation, both deck $215_0$ and deck $215_1$ can be selected (e.g., concurrently selected) to operate on memory cells 210, 211, 212, and 213 of selected memory cell strings of memory cell blocks 290 and 291.

The elements and operations of memory device 600 (e.g., based on chart 600A) may allow it to have improvements over some conventional memory devices. For example, smaller block size may be achieved by the separate data lines of decks $215_0$ and $215_1$. Further, as shown in FIG. 8, in a read or write operation (only one of deck $215_0$ and deck $215_1$ can be selected) the signal on the source (e.g., $SRC_0$ or $SRC_1$) of the unselected deck is provided with voltage Vss (e.g., grounded) and the signal (e.g., $BL0_0$ or $BL0_1$) on the data line of the unselected deck is placed in a float state. This may also cause the channels of the memory cell strings of the unselected deck (e.g., channels similar to the channels in pillar portions 506, 507, and 508 in FIG. 5) of memory device 600 to be in a float state. Therefore, it may help reduce the capacitances on the control gates (e.g., control gates $240_0$, $241_0$, $242_0$, and $243_0$ or control gates $240_1$, $241_1$, $242_1$, and $243_1$) of the unselected deck. It may also help reduce power consumption in memory device 600. Moreover, in an erase operation of a selected deck, gate-induce drain leakage (GIDL) may be generated only in the selected deck and the channels of the memory cell strings of the unselected deck are in a float state (based on chart 600A). Thus, capacitances on the control gates of the unselected deck may be reduced (e.g., relatively small). This may help reduce (or eliminate) the occurrence of soft-program or erasing of some or all of memory cells in the unselected deck.

Figure 9:
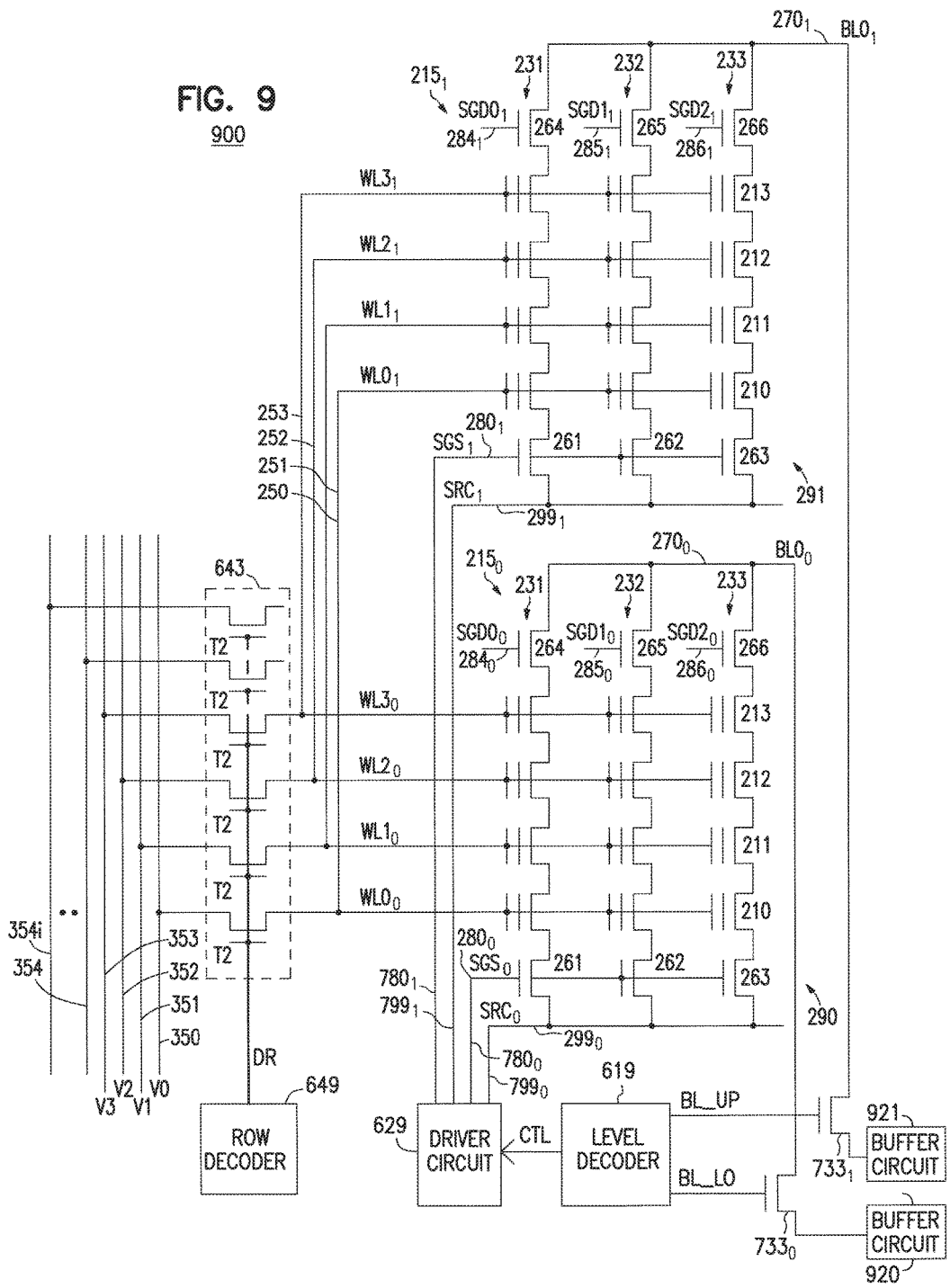
FIG. 9 shows a schematic diagram of a portion of a memory device, which can be a variation of the memory device of FIG. 7, according to some embodiments described herein.

FIG. 9 shows a schematic diagram of a portion of memory device 900, which can be a variation of memory device 600 of FIG. 6 and FIG. 7, according to some embodiments described herein. As shown in FIG. 9, memory device 900 can include elements similar to those of memory elements of memory device 600 of FIG. 7. Thus, for simplicity, similar or identical elements are given the same designation labels and their descriptions are not repeated here. Differences between memory devices 600 and 900 include buffer circuits 920 and 921 of FIG. 9. As shown and described above with reference to FIG. 7, data lines $270_0$ and $270_1$ may share buffer circuit 733. In FIG. 9, data lines $270_0$ and $270_1$ can be coupled to separate buffer circuits 920 and 921.

Memory device 900 can perform a single deck operation in a single deck mode and a multi-deck operation in a multi-deck mode. A single deck operation of memory device 900 can be similar to the operation of memory device 600 described above with reference to FIG. 7 and FIG. 8 (e.g., one (not both) of memory cell blocks 290 and 291 can be selected in a read or write operation). In multi-deck operation of memory device 900, both memory cell blocks 290 and 291 can be selected (e.g., concurrently selected) to access and operate on memory cells 210, 211, 212, and 213 of memory cell blocks 290 and 291. For example, in a multi-deck operation, information can be concurrently provided to memory cell blocks 290 and 291 (through buffer circuits 920 and 921, respectively) to be stored in selected memory cells in memory cell blocks 290 and 291, information can be concurrently read from memory cell blocks 290 and 291 (through buffer circuits 920 and 921), or information in memory cell blocks 290 and 291 can be concurrently erased.

Memory device 900 can have improvements over some conventional memory devices. Such improvements include improvements similar to those of memory device 600 described above with reference to FIG. 6, FIG. 7, and FIG. 8. Further, since data lines $270_0$ and $270_1$ can be coupled to separate buffer circuits 920 and 921, memory device 900 can have a higher throughput (e.g., two times) than memory device 600. This may also allow memory device 900 to have a higher throughput than some conventional memory devices (e.g., two times or higher depending on the number of decks of memory device 900).

FIG. 10 is a chart 900A showing example voltages applied to some signals of memory device 900 of FIG. 9 during read, write, and erase operations of memory device 900, according to some embodiments described herein. The erase operation in chart 900A can be the same as the erase operation in chart 600A (FIG. 8). The read and write operations for a single deck operation (e.g., where only one of decks $215_0$ and $215_1$ is selected at time) in chart 900A can also be the same as the read and write operations in chart 600A (FIG. 8). However, as shown in chart 900A of FIG. 10, both decks $215_0$ and $215_1$ can be selected (e.g., selected in a multi-deck operation) in read and write operations, in which the same voltages can be provided to respective signals decks $215_0$ and $215_1$. Operating memory device 900 with voltages based on chart 900A may allow memory device 900 to have improvements mentioned above.

The illustrations of apparatuses (e.g., memory devices 100, 200, 600, and 900) and methods (e.g., operating methods associated with memory devices 100, 200, 600, and 900, and methods (e.g., processes) of forming at least a portion of memory devices) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 600, and 900) or a system (e.g., a computer, a cellular phone, or other electronic system) that includes a device such as any of memory devices 100, 200, 600, and 900.

Any of the components described above with reference to FIG. 1 through FIG. 10 can be implemented in a number of ways, including simulation via software. Thus, apparatuses (e.g., memory devices 100, 200, 600, and 900 or part of each of these memory devices, including a control unit in these memory devices, such as control unit 118 (FIG. 1)) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 600, and 900 may be included in apparatuses (e.g., electronic circuitry) such as high-speed computers, communication and signal processing circuitry, single or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 10 include apparatuses and methods using a substrate, a first memory cell block including first memory cell strings located over the substrate, first data lines coupled to the first memory cell strings, a second memory cell block including second memory cell strings located over the first memory cell block, second data lines coupled to the second memory cell strings, first conductive paths located over the substrate and coupled between the first data lines and buffer circuitry of the apparatus, and second conductive paths located over the substrate and coupled between the second data lines and the buffer circuitry. No conductive path of the first and second conductive paths is shared by the first and second memory cell blocks. Other embodiments including additional apparatuses and methods are described.

In the detailed description and the claims, a list of items joined by the term "at least one of" can mean any combination of the listed items. For example, if items A and B are listed, then the phrase "at least one of A and B" can mean A only; B only; or A and B. In another example, if items A, B, and C are listed, then the phrase "at least one of A, B and C" can mean A only; B only; C only; A and B (without C); A and C (without B); B and C (without A); or A, B, and C. Each of items A, B, and C can include a single element (e.g., a circuit element) or a plurality of elements (e.g., circuit elements).

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a substrate;
a first memory cell block including first memory cell strings located over the substrate, and first data lines coupled to the first memory cell strings;
a second memory cell block including second memory cell strings located over the first memory cell block, the first memory block being physically located between the second memory block and the substrate, and second data lines coupled to the second memory cell strings, the first data lines being physically located between the second memory block and the substrate;
first conductive paths located over the substrate and coupled between the first data lines and buffer circuitry of the apparatus;
second conductive paths located over the substrate and coupled between the second data lines and the buffer circuitry, wherein no conductive path of the first and second conductive paths is shared by the first and second memory cell blocks;
access lines coupled to the first and second memory cell strings, wherein the first and second memory cell blocks share the access lines; and
transistors, each of the transistors coupled to a respective access line of the access lines, wherein the transistors include a common gate.

2. An apparatus comprising:
a substrate;
a first memory cell block including first memory cell strings located over the substrate, and first data lines coupled to the first memory cell strings;
a second memory cell block including second memory cell strings located over the first memory cell block, the first memory block being physically located between the second memory block and the substrate, and second data lines coupled to the second memory cell strings, the first data lines being physically located between the second memory block and the substrate;
first conductive paths located over the substrate and coupled between the first data lines and buffer circuitry of the apparatus; and
second conductive paths located over the substrate and coupled between the second data lines and the buffer circuitry, wherein no conductive path of the first and second conductive paths is shared by the first and second memory cell blocks, wherein the buffer circuitry includes:
a first buffer circuit;
a first transistor coupled between the first buffer circuit and one of the first conductive paths;
a second buffer circuit; and
a second transistor coupled between the second buffer circuit and one of the second conductive paths.

3. An apparatus comprising:
a substrate;
a first memory cell block including first memory cell strings located over the substrate, and first data lines coupled to the first memory cell strings;
a second memory cell block including second memory cell strings located over the first memory cell block, the first memory block being physically located between the second memory block and the substrate, and second data lines coupled to the second memory cell strings, the first data lines being physically located between the second memory block and the substrate;
first conductive paths located over the substrate and coupled between the first data lines and buffer circuitry of the apparatus; and
second conductive paths located over the substrate and coupled between the second data lines and the buffer circuitry, wherein no conductive path of the first and second conductive paths is shared by the first and second memory cell blocks, wherein the buffer circuitry includes:
a buffer circuit;
a first transistor coupled between the buffer circuit and one of the first conductive paths; and
a second transistor coupled between the buffer circuit and one of the second conductive paths.

4. An apparatus comprising:
a substrate;
a first memory cell block including first memory cell strings located over the substrate, and first data lines coupled to the first memory cell strings;
a second memory cell block including second memory cell strings located over the first memory cell block, and second data lines coupled to the second memory cell strings;
first conductive paths located over the substrate and coupled between the first data lines and buffer circuitry of the apparatus;
second conductive paths located over the substrate and coupled between the second data lines and the buffer circuitry, wherein no conductive path of the first and second conductive paths is shared by the first and second memory cell blocks;
a first source select line coupled to each of the first memory cell strings, the first source select line to control first select transistors, each of the first select transistors being located along a segment of a respective pillar among pillars of the first memory cell strings;
a second source select line coupled to each of the second memory cell strings, the second source select line to control second select transistors, each of the second select transistors being located along a segment of a respective pillar among pillars of the second memory cell strings;
a first additional conductive path coupled to the first source select line and a driver circuit; and
a second additional conductive path coupled to the second source select line and the driver circuit, wherein the first additional conductive path is separate from the second additional conductive path.

5. An apparatus comprising:
a substrate;
a first memory cell block including first memory cell strings located over the substrate, and first data lines coupled to the first memory cell strings;
a second memory cell block including second memory cell strings located over the first memory cell block, and second data lines coupled to the second memory cell strings;

first conductive paths located over the substrate and coupled between the first data lines and buffer circuitry of the apparatus;
second conductive paths located over the substrate and coupled between the second data lines and the buffer circuitry, wherein no conductive path of the first and second conductive paths is shared by the first and second memory cell blocks;
a first conductive line contacting a pillar of each of the first memory cell strings;
a second conductive line contacting a pillar of each of the second of memory cell strings;
a first additional conductive path coupled to the first conductive line and a driver circuit; and
a second additional conductive path coupled to the second conductive line and the driver circuit, wherein the first additional conductive path is separate from the second additional conductive path.

6. An apparatus comprising:
a substrate;
a first memory cell block including first memory cell strings located over the substrate, and first data lines coupled to the first memory cell strings;
a second memory cell block including second memory cell strings located over the first memory cell block, and second data lines coupled to the second memory cell strings;
first conductive paths located over the substrate and coupled between the first data lines and buffer circuitry of the apparatus;
second conductive paths located over the substrate and coupled between the second data lines and the buffer circuitry, wherein no conductive path of the first and second conductive paths is shared by the first and second memory cell blocks;
a first deck of memory cell strings located over the substrate, the first deck of memory cell strings being physically located in a first portion of a memory device of the apparatus, the first deck of memory cell strings including a first plurality memory cell blocks physically located in the first portion of the memory device, wherein the first memory cell block is included in the first plurality memory cell blocks; and
a second deck of memory cell strings located over the first deck of memory cell strings, the second deck of memory cell strings being physically located between the second portion of the memory device and the substrate, the second deck of memory cell strings including a second plurality memory cell blocks physically located in the second portion of the memory device, wherein the second memory cell block is included in the second plurality memory cell blocks.

7. An apparatus comprising:
decks of memory cell strings including a first deck of first memory cell strings located over a substrate, and second deck of second memory cell strings located over the first deck of first memory cell strings, the first deck of memory cell strings being physically located in a first portion of a memory device of the apparatus, the second deck of memory cell strings being physically located in a second portion of the memory device, the first portion of the memory device being physically located between the second portion of the memory device and the substrate;
access lines coupled to the decks of memory cell strings;
data lines coupled to the decks of memory cell strings, wherein no deck of memory cell strings of the decks of memory cell strings shares an access line of the access lines with another deck of memory cell strings of the decks of memory cell strings, and no deck of memory cell strings of the decks of memory cell strings shares a data line of the data lines with another deck of memory cell strings of the decks of memory cell strings;
first transistors, each of the first transistors coupled to a respective access line of first access lines among the access lines;
second transistors, each of the second transistors coupled to a respective access line of second access lines among the access lines, wherein the first transistors include a first common gate, and the second transistors include a second common gate different from the first common gate; and
a decoder to concurrently turn on the first and second transistors during a memory operation of the apparatus.

8. An apparatus comprising:
decks of memory cell strings including a first deck of first memory cell strings located over a substrate, and second deck of second memory cell strings located over the first deck of first memory cell strings;
access lines coupled to the decks of memory cell strings;
data lines coupled to the decks of memory cell strings, wherein no deck of memory cell strings of the decks of memory cell strings shares an access line of the access lines with another deck of memory cell strings of the decks of memory cell strings, and no deck of memory cell strings of the decks of memory cell strings shares a data line of the data lines with another deck of memory cell strings of the decks of memory cell strings;
first transistors, each of the first transistors coupled to a respective access line of first access lines among the access lines;
second transistors, each of the second transistors coupled to a respective access line of second access lines among the access lines, wherein the first transistors include a first common gate, and the second transistors include a second common gate different from the first common gate; and
a decoder to turn on the first transistors during a memory operation of the apparatus, and turn off the second transistors while the first transistors are turned on during the memory operation.

9. An apparatus comprising:
decks of memory cell strings including a first deck of first memory cell strings located over a substrate, and second deck of second memory cell strings located over the first deck of first memory cell strings, the first deck of memory cell strings being physically located in a first portion of a memory device of the apparatus, the second deck of memory cell strings being physically located in a second portion of the memory device, the first portion of the memory device being physically located between the second portion of the memory device and the substrate;
access lines coupled to the decks of memory cell strings; and
data lines coupled to the decks of memory cell strings, wherein no deck of memory cell strings of the decks of memory cell strings shares an access line of the access lines with another deck of memory cell strings of the decks of memory cell strings, and no deck of memory cell strings of the decks of memory cell strings shares a data line of the data lines with another deck of memory cell strings of the decks of memory cell strings;

first conductive paths located over a substrate and coupled to first data lines among the data lines;

second conductive paths located over the substrate and coupled to second data lines among the data lines, wherein the first conductive paths are separate from the second conductive paths;

a decoder to concurrently couple the first conductive paths and the second conductive paths to circuitry in the substrate during a memory operation of the apparatus.

10. An apparatus comprising:

decks of memory cell strings including a first deck of first memory cell strings located over a substrate, and second deck of second memory cell strings located over the first deck of first memory cell strings;

access lines coupled to the decks of memory cell strings;

data lines coupled to the decks of memory cell strings, wherein no deck of memory cell strings of the decks of memory cell strings shares an access line of the access lines with another deck of memory cell strings of the decks of memory cell strings, and no deck of memory cell strings of the decks of memory cell strings shares a data line of the data lines with another deck of memory cell strings of the decks of memory cell strings;

first conductive paths located over a substrate and coupled to first data lines among the data lines;

second conductive paths located over the substrate and coupled to second data lines among the data lines, wherein the first conductive paths are separate from the second conductive paths; and a decoder to couple the first conductive paths to circuitry in the substrate during a memory operation of the apparatus, and not to couple the second conductive paths to the circuitry in the substrate during the memory operation.

* * * * *